US011271027B2

(12) United States Patent
Kawashima

(10) Patent No.: US 11,271,027 B2
(45) Date of Patent: Mar. 8, 2022

(54) SEMICONDUCTOR DEVICE

(71) Applicant: SONY SEMICONDUCTOR SOLUTIONS CORPORATION, Kanagawa (JP)

(72) Inventor: Hiroyuki Kawashima, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/958,481

(22) PCT Filed: Nov. 30, 2018

(86) PCT No.: PCT/JP2018/044305
§ 371 (c)(1),
(2) Date: Jun. 26, 2020

(87) PCT Pub. No.: WO2019/135333
PCT Pub. Date: Jul. 11, 2019

(65) Prior Publication Data
US 2021/0066380 A1 Mar. 4, 2021

(30) Foreign Application Priority Data
Jan. 5, 2018 (JP) .............................. JP2018-000630

(51) Int. Cl.
*H01L 27/146* (2006.01)
*H01L 21/768* (2006.01)
(Continued)

(52) U.S. Cl.
CPC .... *H01L 27/14636* (2013.01); *H01L 21/7682* (2013.01); *H01L 21/76804* (2013.01);
(Continued)

(58) Field of Classification Search
CPC ............... H01L 21/768; H01L 21/7682; H01L 21/76804; H01L 23/48; H01L 23/481;
(Continued)

(56) References Cited

U.S. PATENT DOCUMENTS 6,064,118 A 5/2000 Sasaki
6,346,475 B1 2/2002 Suzuki et al.
(Continued)

FOREIGN PATENT DOCUMENTS

CN 103985740 A 8/2014
CN 105409002 A 3/2016
(Continued)

OTHER PUBLICATIONS

International Search Report and Written Opinion of PCT Application No. PCT/JP2018/044305, dated Feb. 26, 2019, 09 pages of ISRWO.

*Primary Examiner* — Chuong A Luu
(74) *Attorney, Agent, or Firm* — Chip Law Group

(57) ABSTRACT

To reduce the capacitance between wiring lines of a semiconductor device, while maintaining mechanical strength and reliability. A semiconductor device including: a multilayer wiring layer in which a plurality of interlayer films and a plurality of diffusion preventing films are alternately stacked, and a wiring line is formed in the interlayer films; a contact via that penetrates a via insulating layer formed on one surface of the multilayer wiring layer, and is electrically connected to the wiring line of the multilayer wiring layer; a through hole that penetrates at least one of the interlayer films and the diffusion preventing films from the other surface of the multilayer wiring layer on the opposite side from the one surface; and an air gap that is connected to the through hole, and is formed in at least one of the interlayer films, to expose the contact via.

14 Claims, 32 Drawing Sheets

(51) Int. Cl.
*H01L 23/48* (2006.01)
*H01L 23/522* (2006.01)
*H01L 23/532* (2006.01)

(52) U.S. Cl.
CPC ........ *H01L 23/481* (2013.01); *H01L 23/5226* (2013.01); *H01L 23/53238* (2013.01); *H01L 23/53266* (2013.01); *H01L 27/14634* (2013.01)

(58) Field of Classification Search
CPC ... H01L 23/522; H01L 23/532; H01L 23/535; H01L 23/5222; H01L 23/5226; H01L 23/53238; H01L 23/53266; H01L 23/532295; H01L 27/146; H01L 27/14634; H01L 27/14636; H01L 23/5221; H01L 23/53223; H01L 23/53252; H01L 21/3205; H01L 21/76898; H01L 21/32155; H01L 21/823475; H01L 221/76877; H01L 21/76883; H01L 21/76841; H01L 21/76876; H01L 21/02362; H01L 21/76895; H01L 2221/10; H01L 2221/1094; H01L 2221/1042; H01L 2221/1047; H01L 2221/1089; H01L 2221/1073
USPC ........................................................ 257/621
See application file for complete search history.

(56) References Cited

U.S. PATENT DOCUMENTS

| | | | |
|---|---|---|---|
| 2008/0179750 A1* | 7/2008 | Arnal | H01L 23/5226 257/758 |
| 2009/0104729 A1* | 4/2009 | Koizumi | H01L 27/14612 438/69 |
| 2014/0225251 A1 | 8/2014 | Lee et al. | |
| 2016/0204156 A1 | 7/2016 | Togashi | |
| 2018/0240834 A1 | 8/2018 | Tanaka et al. | |
| 2019/0181168 A1* | 6/2019 | Kawashima | H01L 23/53295 |

FOREIGN PATENT DOCUMENTS

| | | |
|---|---|---|
| CN | 107408567 A | 11/2017 |
| EP | 0872887 A2 | 10/1998 |
| EP | 2768020 A2 | 8/2014 |
| JP | 10-294316 A | 11/1998 |
| JP | 2001-110745 A | 4/2001 |
| JP | 2001-217312 A | 8/2001 |
| JP | 2002-353303 A | 12/2002 |
| JP | 2006-019401 A | 1/2006 |
| JP | 2014-154886 A | 8/2014 |
| JP | 2015-038931 A | 2/2015 |
| KR | 10-2014-0101986 A | 8/2014 |
| KR | 10-2016-0045054 A | 4/2016 |
| TW | 376549 B | 12/1999 |
| TW | 473973 B | 1/2002 |
| TW | 201436175 A | 9/2014 |
| WO | 2015/025723 A1 | 2/2015 |
| WO | 2016/158440 A1 | 10/2016 |

\* cited by examiner

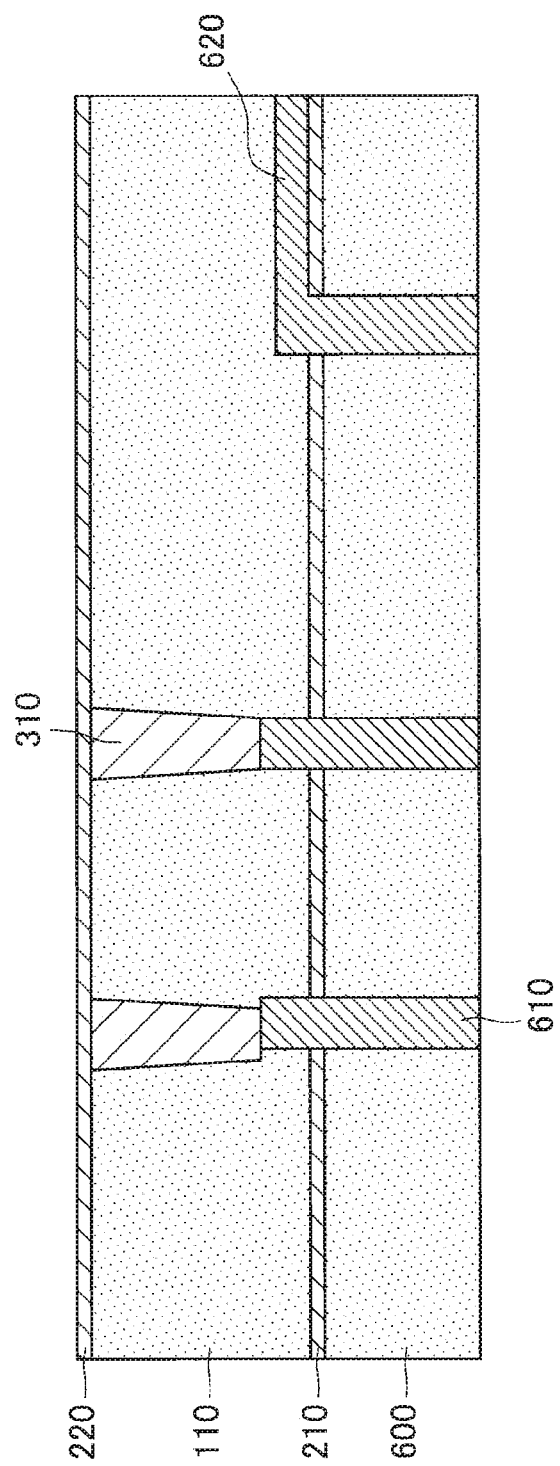

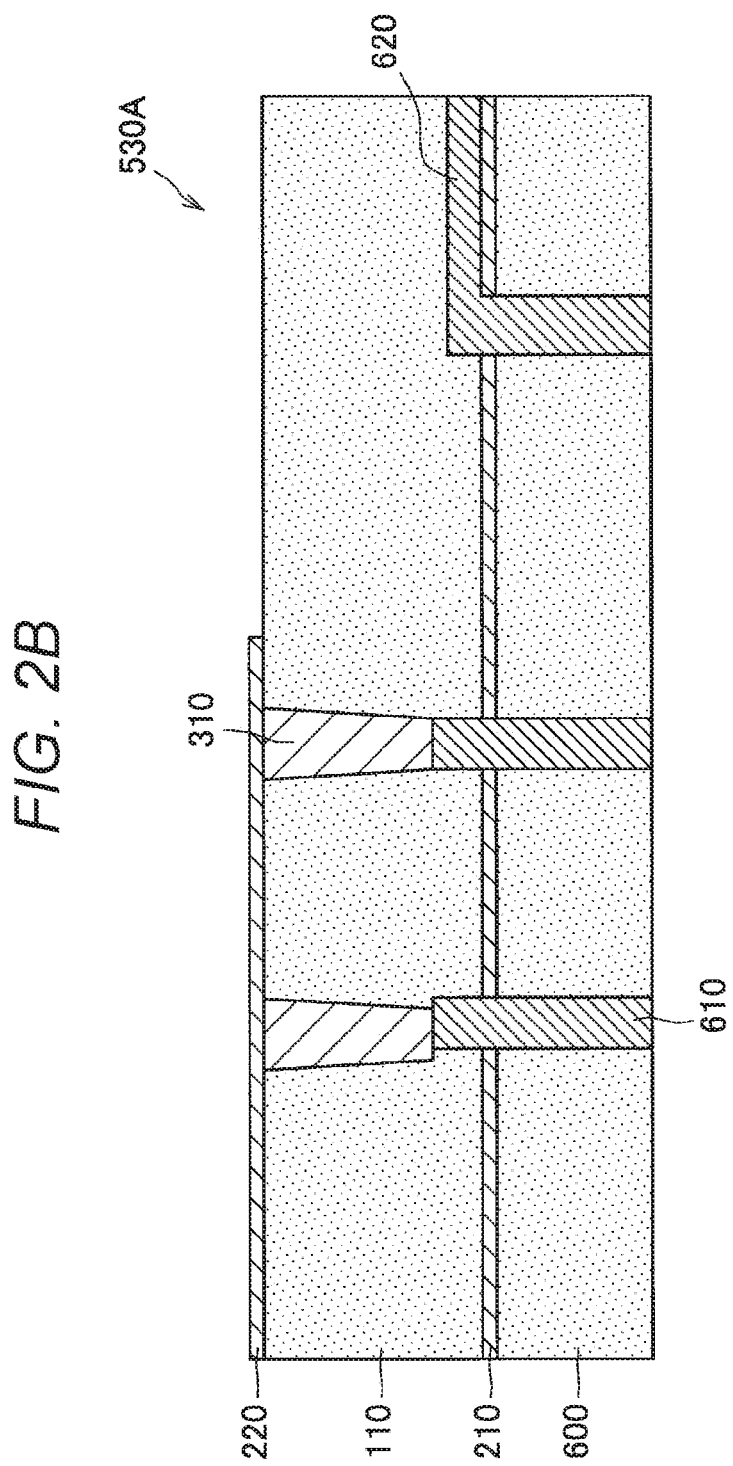

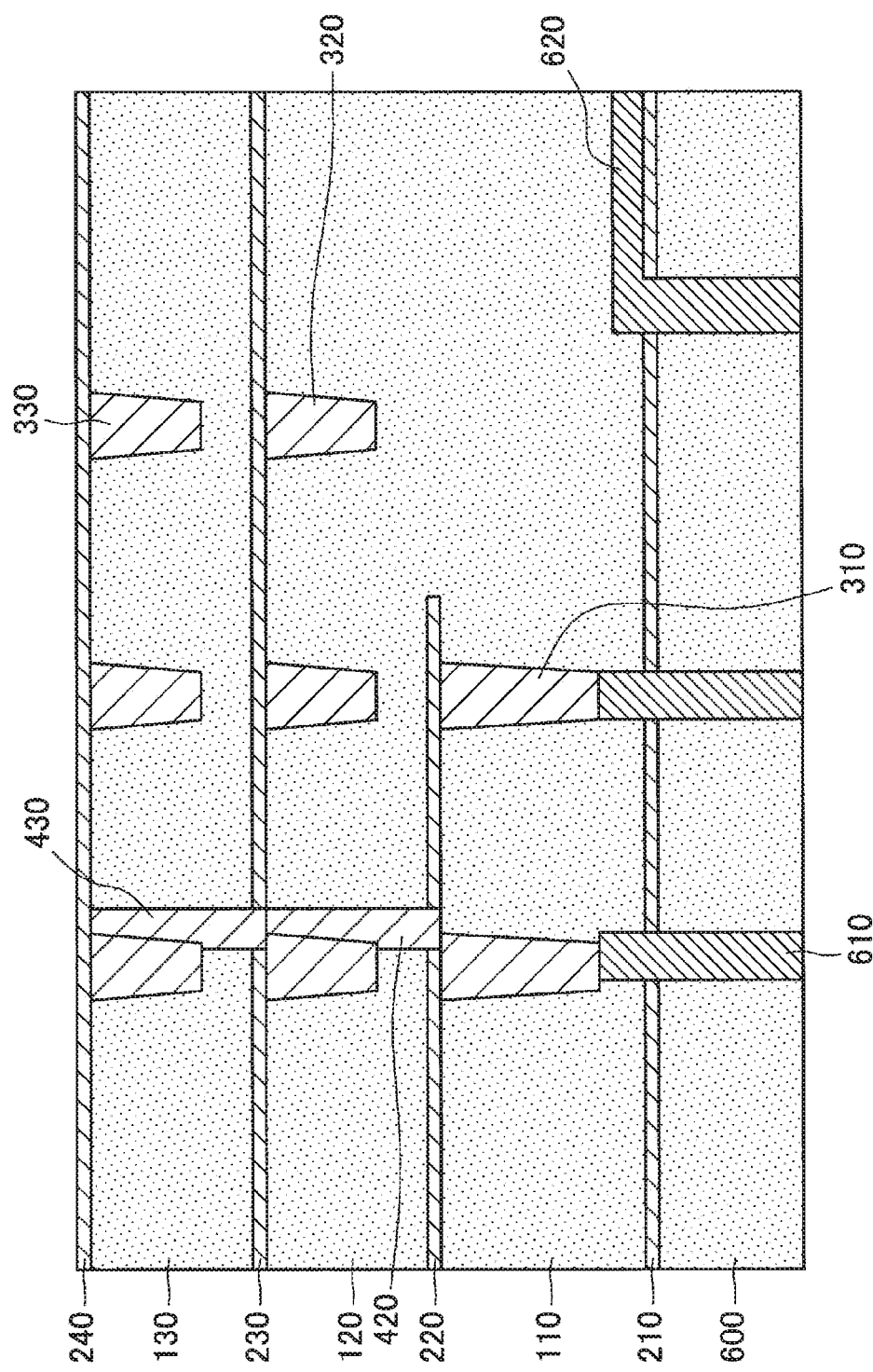

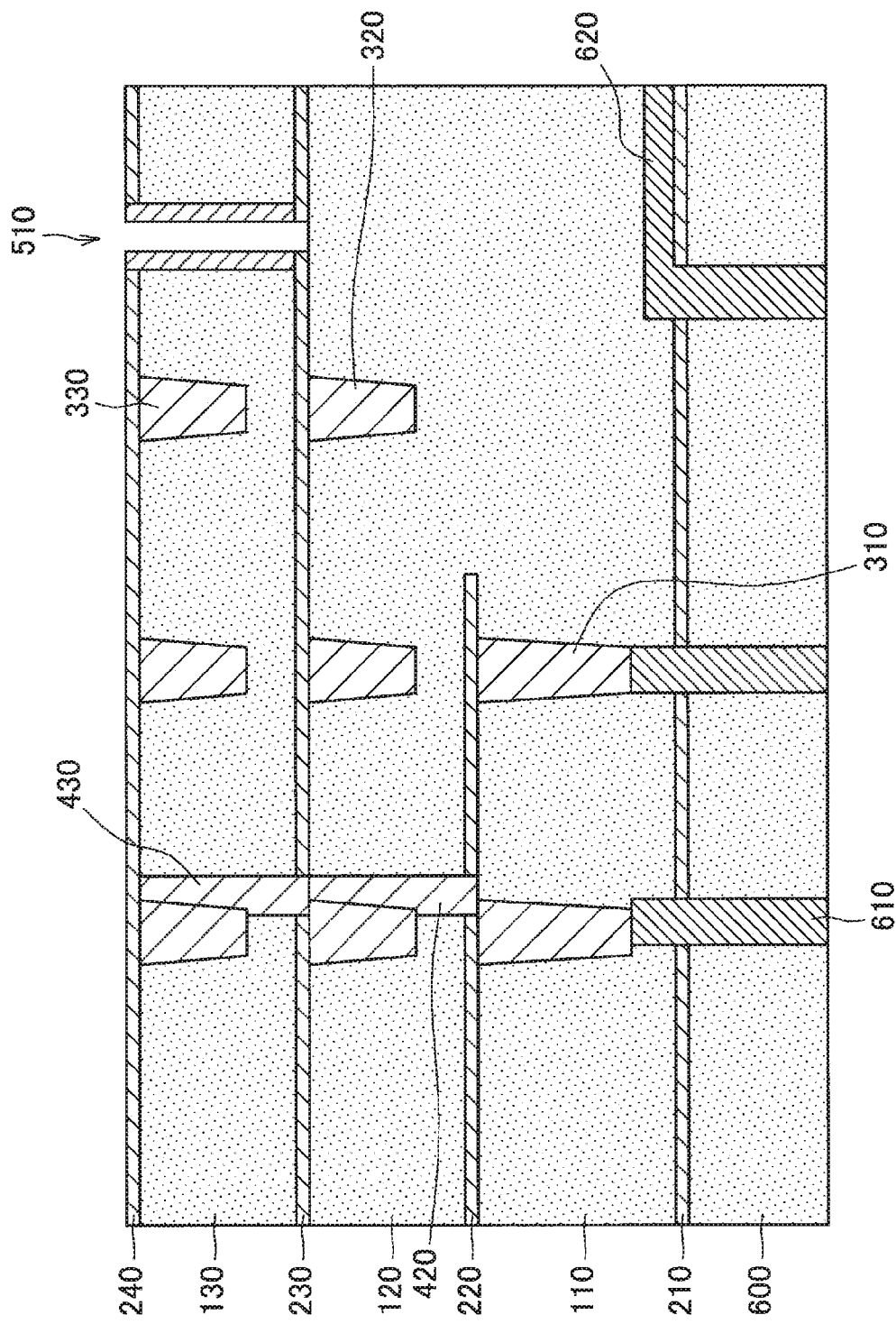

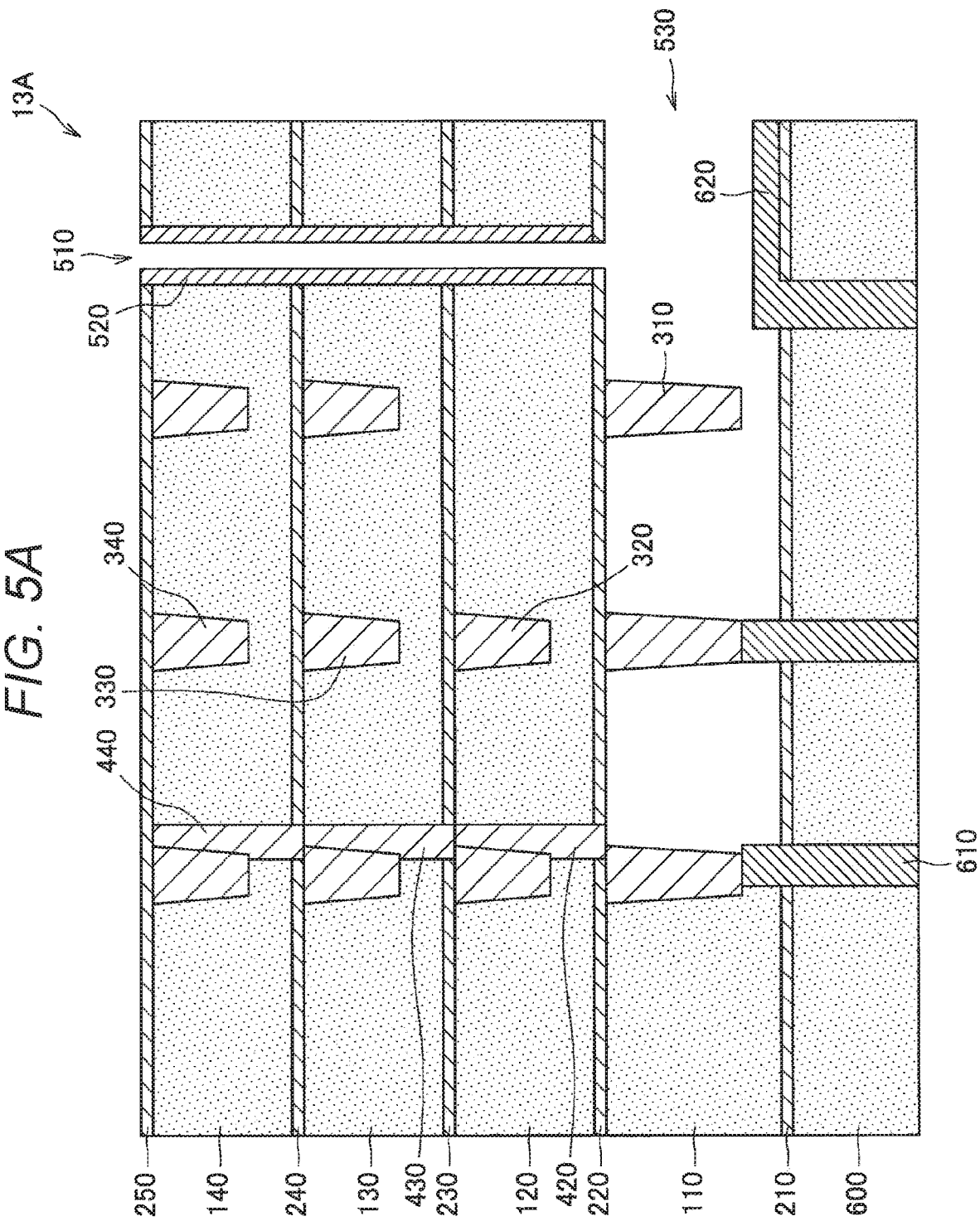

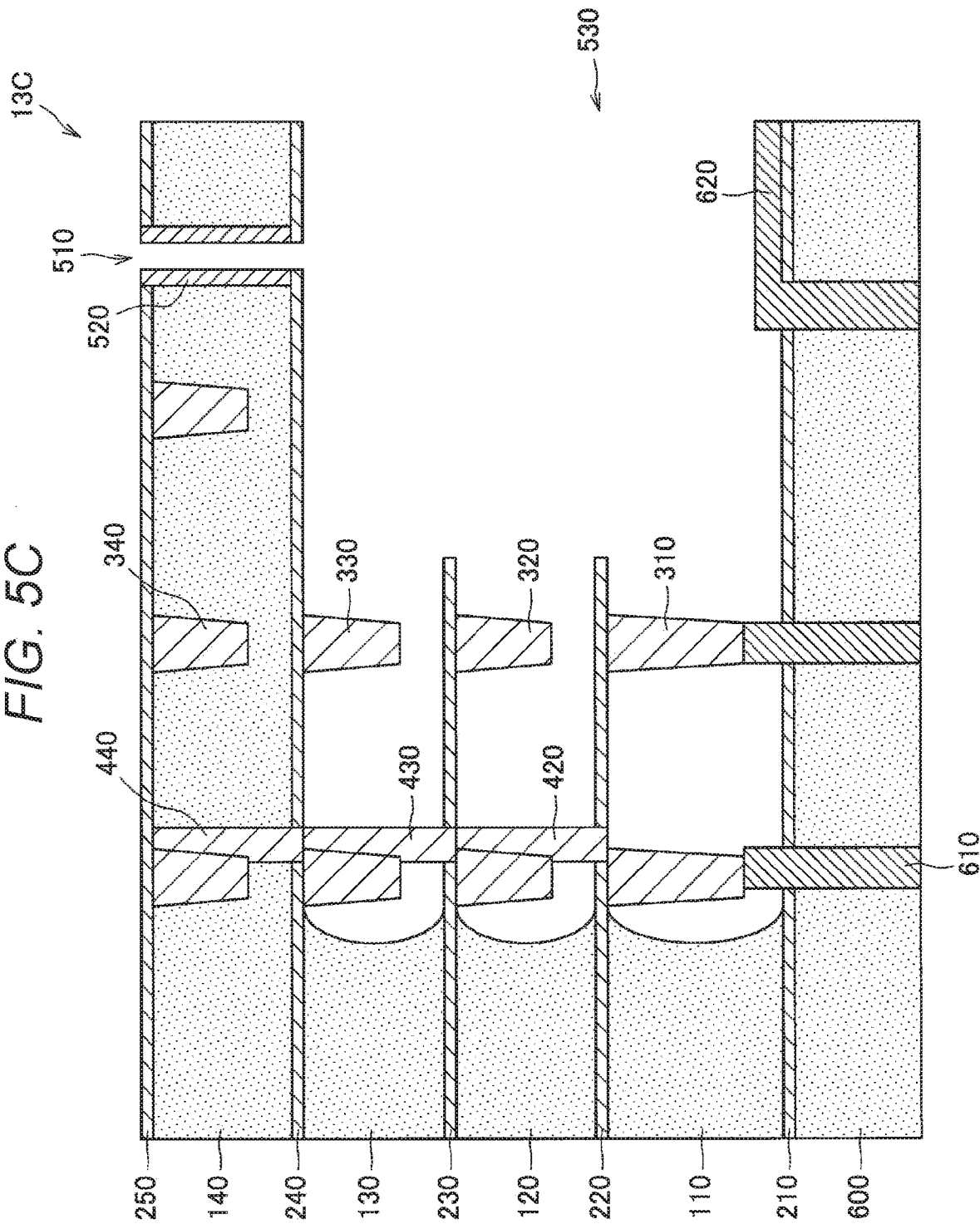

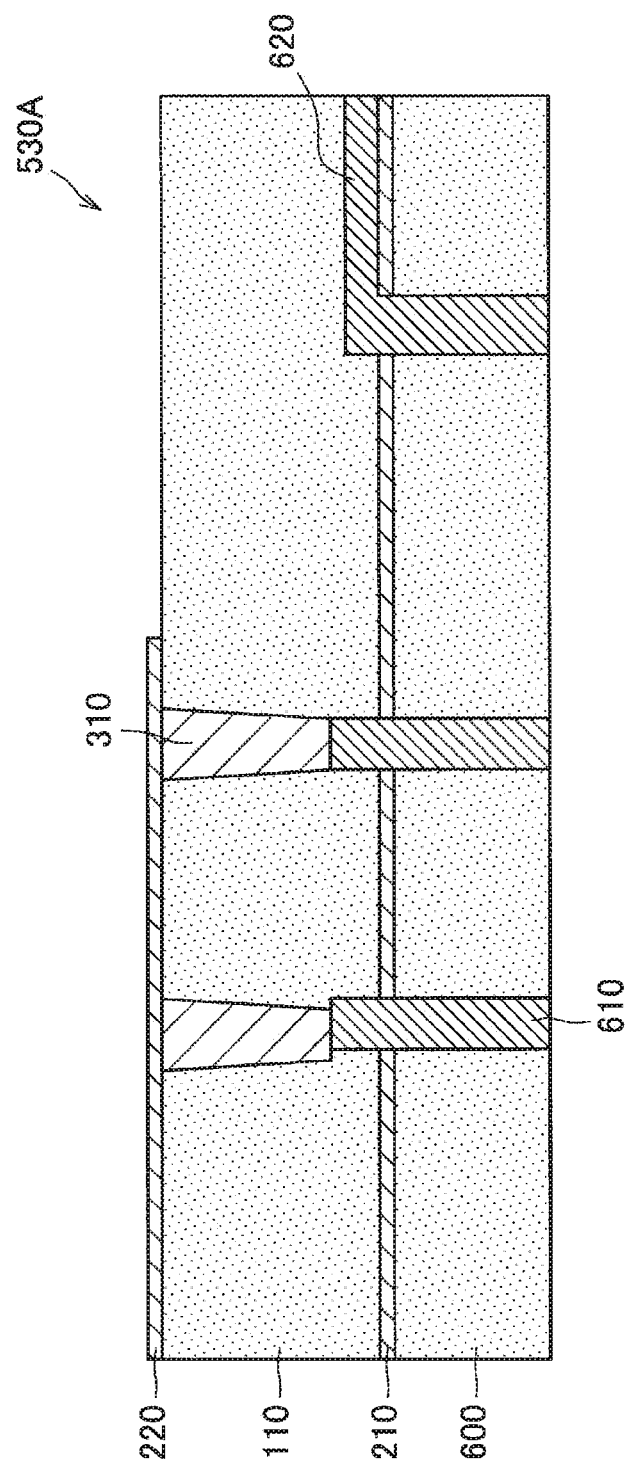

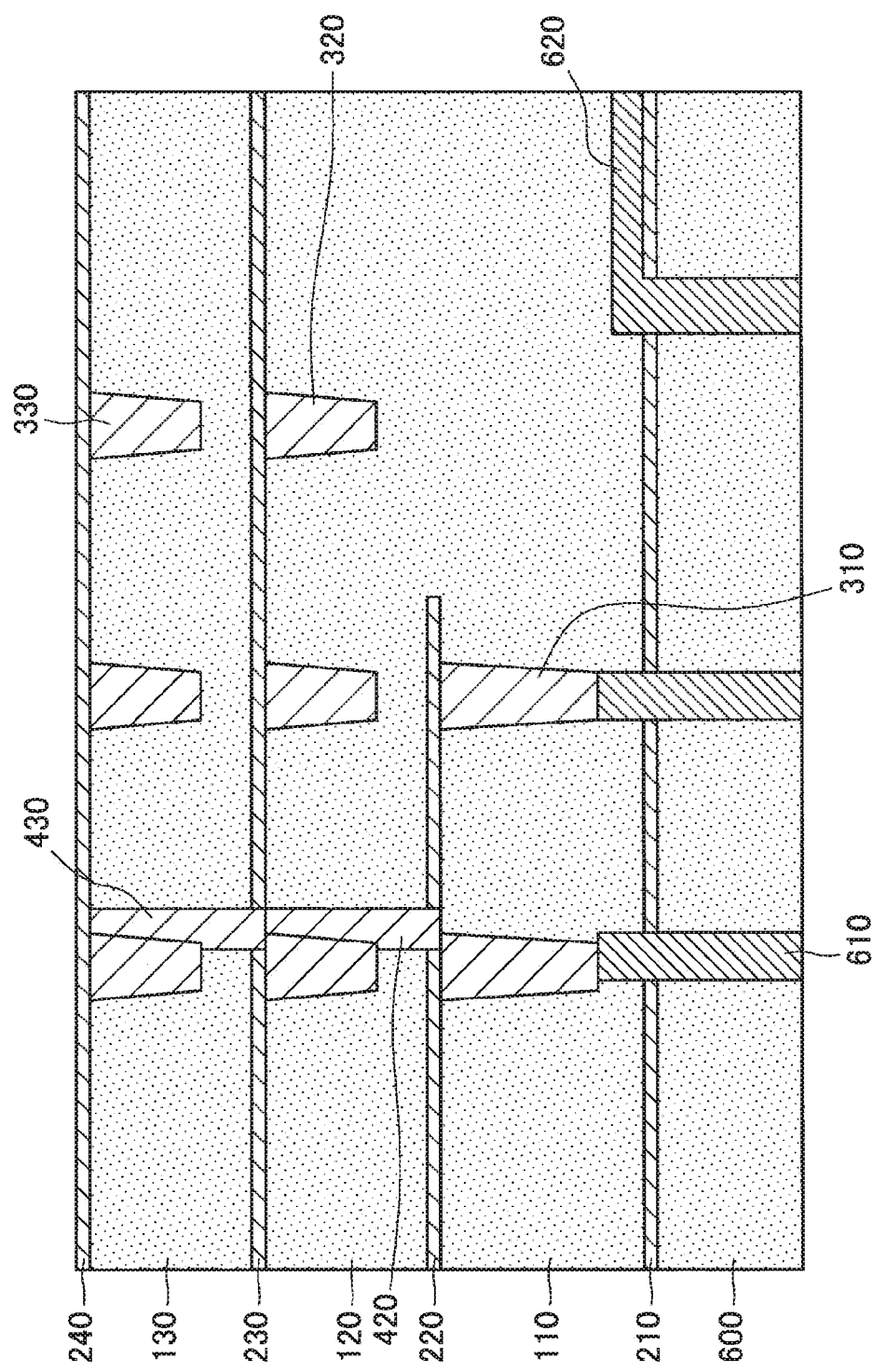

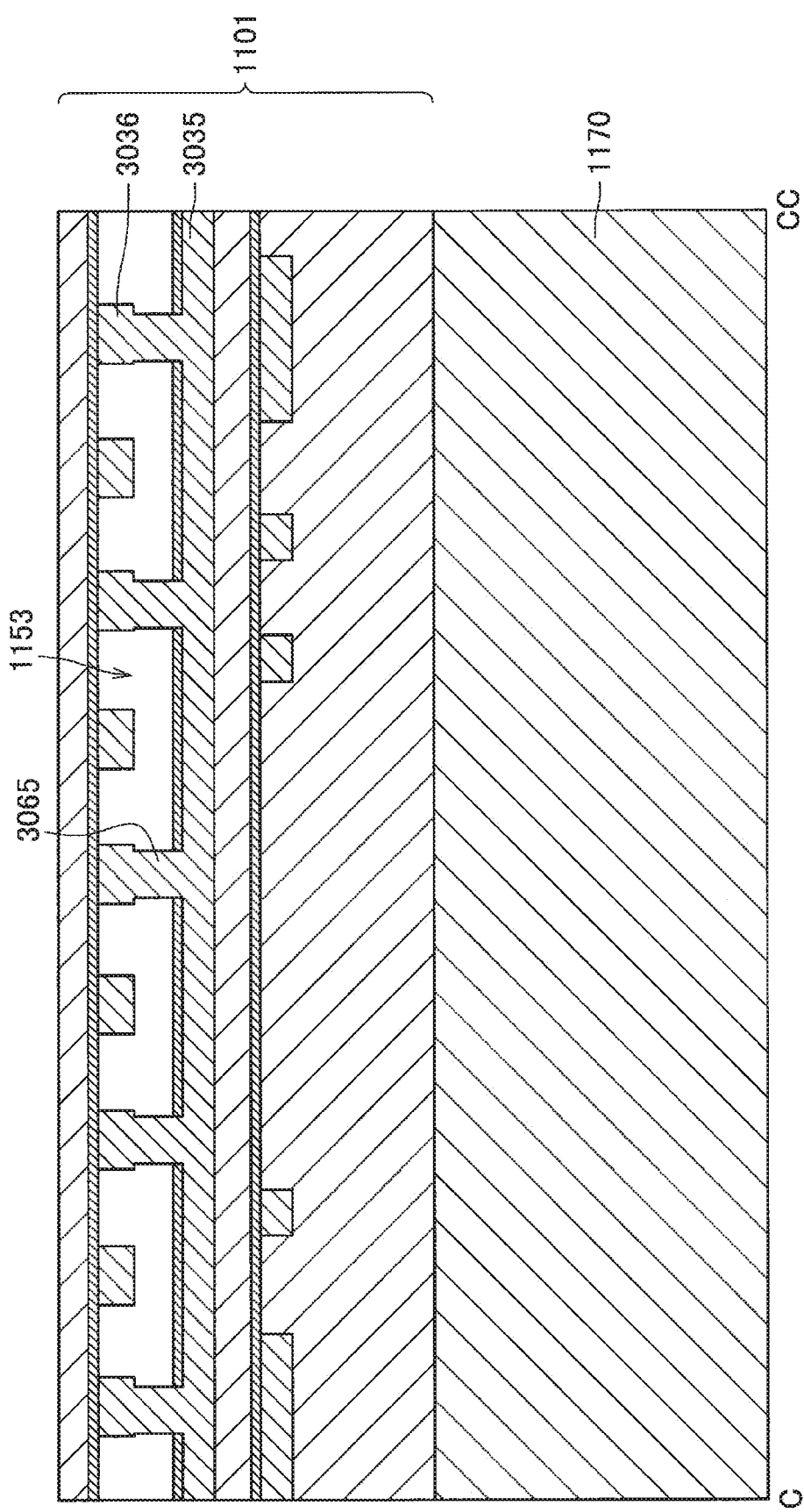

SEMICONDUCTOR DEVICE

CROSS REFERENCE TO RELATED APPLICATIONS

This application is a U.S. National Phase of International Patent Application No. PCT/JP2018/044305 filed on Nov. 30, 2018, which claims priority benefit of Japanese Patent Application No. JP 2018-000630 filed in the Japan Patent Office on Jan. 5, 2018. Each of the above-referenced applications is hereby incorporated herein by reference in its entirety.

TECHNICAL FIELD

The present disclosure relates to a semiconductor device.

BACKGROUND ART

As semiconductor devices have been becoming smaller and smaller in size these days, wiring delays that lower the operation speeds of semiconductor devices have been increasing. Specifically, in a semiconductor device, wiring resistance increases due to a decrease in the cross-sectional area of the wiring lines, and therefore, a delay proportional to the product of the wiring resistance and the capacitance between wiring lines increases (this delay is also referred to as an RC delay).

To reduce such a wiring delay, studies have been made to lower the dielectric constant of an interlayer film between wiring lines. However, no interlayer film material that achieves a sufficiently low dielectric constant has been found at present.

In view of this, consideration has been given to a method for further lowering the dielectric constant between wiring lines by removing the material between the wiring lines and forming a hollow layer (also referred to as an air gap) having a relative dielectric constant of 1 between the wiring lines.

For example, Patent Document 1 mentioned below discloses provision of a structure that does not damage wiring lines when an insulating film between the wiring lines is removed to form an air gap structure.

CITATION LIST

Patent Document

Patent Document 1: Japanese Patent Application Laid-Open No. 2006-19401

SUMMARY OF THE INVENTION

Problems to be Solved by the Invention

By the technology disclosed in Patent Document 1, however, a thin film having low mechanical strength protrudes into a space in which an air gap is formed, and therefore, there is a possibility that the thin film protruding into the air gap will collapse. Further, by the technology disclosed in Patent Document 1, in a case where the distance between wiring lines is long, the mechanical strength of the entire semiconductor device is lower due to the air gaps, and therefore, there is a possibility that the reliability of the semiconductor device will drop.

In view of the above, the present disclosure suggests a new and improved semiconductor device capable of reducing the capacitance between wiring lines while maintaining mechanical strength and reliability.

Solutions to Problems

The present disclosure is to provide a semiconductor device that includes: a multilayer wiring layer in which a plurality of interlayer films and a plurality of diffusion preventing films are alternately stacked, and a wiring line is formed in the interlayer films; a contact via that penetrates a via insulating layer formed on one surface of the multilayer wiring layer, and is electrically connected to the wiring line of the multilayer wiring layer; a through hole that penetrates at least one of the interlayer films and the diffusion preventing films from the other surface of the multilayer wiring layer on the opposite side from the one surface; and an air gap that is connected to the through hole, and is formed in at least one of the interlayer films, to expose the contact via.

According to the present disclosure, an interlayer film in a predetermined region in the stacking direction and the in-plane direction is removed, so that an air gap can be formed in a region around a contact via that connects a semiconductor substrate to a wiring line.

Effects of the Invention

As described above, according to the present disclosure, it is possible to reduce the capacitance between wiring lines, while maintaining the mechanical strength and the reliability of a semiconductor device.

Note that the effect described above is not necessarily restrictive, and it is possible to achieve any one of the effects described in this specification together with the above mentioned effect or instead of the above mentioned effect, or it is possible to achieve other effects obvious from this specification.

BRIEF DESCRIPTION OF DRAWINGS

FIG. 2A is a cross-sectional view illustrating a step in a method for manufacturing the semiconductor device according to the embodiment.

FIG. 2B is a cross-sectional view illustrating a step in the method for manufacturing the semiconductor device according to the embodiment.

FIG. 2C is a cross-sectional view illustrating a step in the method for manufacturing the semiconductor device according to the embodiment.

FIG. 2F is a cross-sectional view illustrating a step in the method for manufacturing the semiconductor device according to the embodiment.

FIG. 5A is a cross-sectional view of a semiconductor device according to a third modification of the embodiment, taken in the stacking direction.

FIG. 5C is a cross-sectional view of a semiconductor device according to the third modification of the embodiment, taken in the stacking direction.

FIG. 8B is a cross-sectional view illustrating a step in the method for manufacturing the semiconductor device according to the embodiment.

FIG. 8C is a cross-sectional view illustrating a step in the method for manufacturing the semiconductor device according to the embodiment.

FIG. 13C is a cross-sectional view showing a cross-section taken along the C-CC line shown in FIG. 12.

MODES FOR CARRYING OUT THE INVENTION

Figure 1:
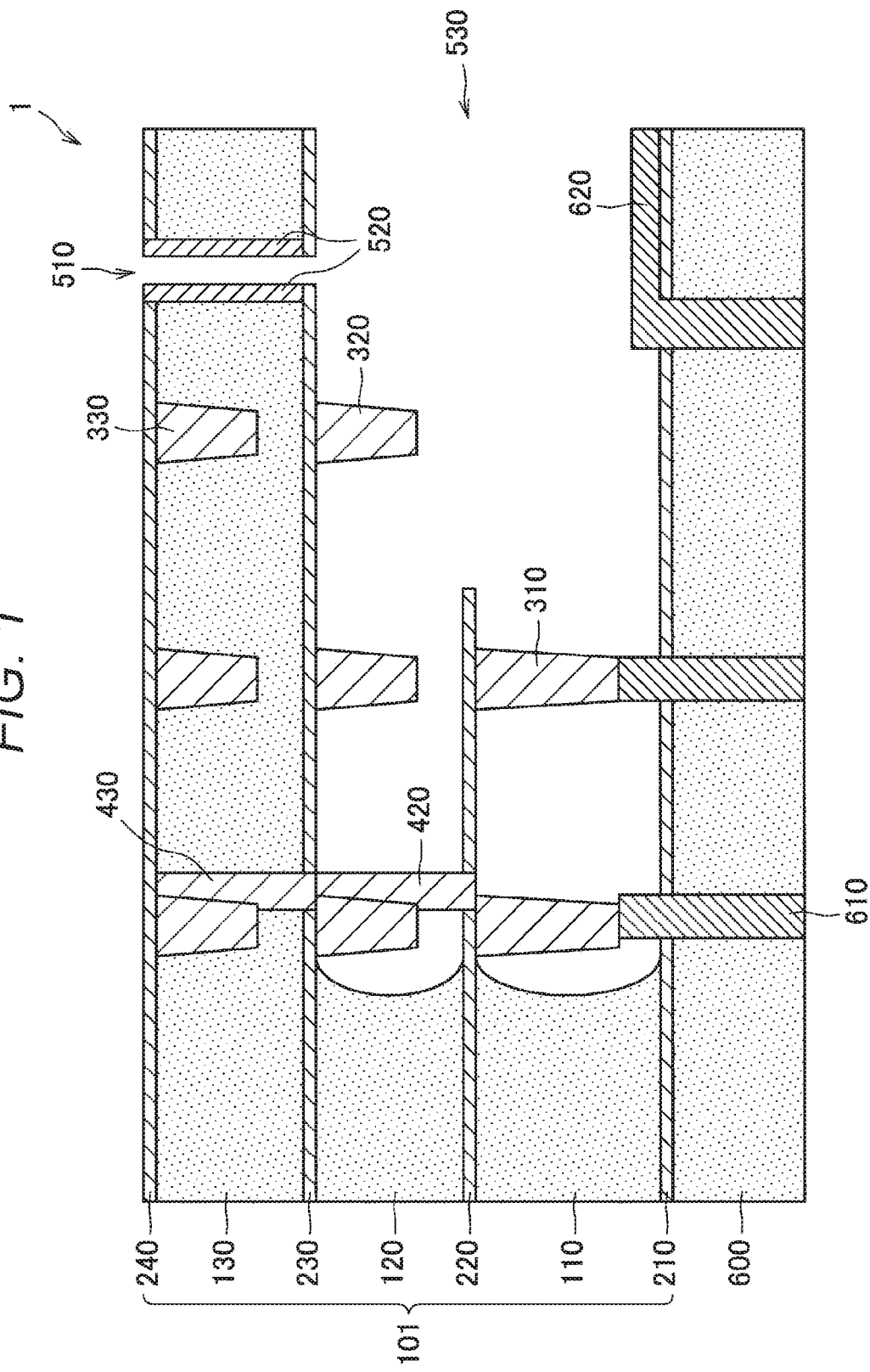
FIG. 1 is a cross-sectional view of a semiconductor device according to a first embodiment of the present disclosure, taken in the stacking direction.

The following is a detailed description of preferred embodiments of the present disclosure, with reference to the accompanying drawings. Note that, in this specification and the drawings, components having substantially the same functional configurations are denoted by the same reference numerals, and explanation of them will not be repeated.

In the respective drawings to be referred to in the description below, the sizes of some components are shown larger than they actually are in some cases, for ease of explanation. Therefore, the relative sizes of the components shown in the respective drawings do not always accurately represent the size relationship between the actual components. Further, in the description below, the direction in which substrates or layers are stacked will be sometimes referred to as the upward direction.

Note that explanation will be made in the following order.
1. First embodiment
1.1. Example configuration
1.2. Manufacturing method
1.3. Modifications
2. Second embodiment
2.1. Example configuration
2.2. Manufacturing method
2.3. Modifications
3. Third embodiment
4. Example applications
4.1. First application
4.2. Second application
4.3. Third application

1. First Embodiment (1.1. Example Configuration)

Referring first to FIG. 1, the configuration of a semiconductor device according to a first embodiment of the present disclosure is described. FIG. 1 is a cross-sectional view of a semiconductor device according to this embodiment, taken in the stacking direction. Note that FIG. 1 shows part of a cross-section of a semiconductor device 1 according to this embodiment, and the semiconductor device 1 of course extends to regions that are not shown in the drawing.

As shown in FIG. 1, the semiconductor device 1 includes a via insulating layer 600, and a multilayer wiring layer 101 in which first through third interlayer films 110, 120, and 130, and first through fourth diffusion preventing films 210, 220, 230, and 240 are alternately stacked.

Contact vias 610 and a zeroth wiring line 620 are formed in the via insulating layer 600, and first through third wiring lines 310, 320, and 330 are formed in the first through third interlayer films 110, 120, and 130, respectively. The first through third wiring lines 310, 320, and 330 are electrically connected to one another by second and third through vias 420 and 430.

Hereinafter, the first through third interlayer films 110, 120, and 130 will be also collectively referred to as the interlayer films 100, and the first through fourth diffusion preventing films 210, 220, 230, and 240 will be also collectively referred to as the diffusion preventing films 200. Further, the first through third wiring lines 310, 320, and 330 will be also collectively referred to as the wiring lines 300, and the second and third through vias 420 and 430 will be also collectively referred to as the through vias 400.

That is, the semiconductor device 1 includes the multilayer wiring layer 101 in which the interlayer films 100 including the wiring lines 300 and the through vias 400, and the diffusion preventing films 200 are alternately stacked.

Note that, in FIG. 1, the multilayer wiring layer 101 has a structure in which the first through third interlayer films 110, 120, and 130, and the first through fourth diffusion preventing films 210, 220, 230, and 240 are alternately stacked. However, the technology according to the present disclosure is not limited to such an example. The multilayer wiring layer 101 may include four or five or more interlayer films 100, for example. Further, the multilayer wiring layer 101 may be formed with interlayer films 100 and diffusion preventing films 200 that are the same in number.

The interlayer films 100 electrically insulate the wiring lines 300 from one another, and are principal layer members forming the semiconductor device 1. The interlayer films 100 are formed with an insulating material on which etching can be easily performed (specifically, on which etching can be performed more easily than on the diffusion preventing films 200 described later), and may be formed with an insulating material such as $SiO_2$, for example. Alternatively, the interlayer films 100 may be formed with an organic resin, a low-k material such as carbon-doped $SiO_2$ or porous silica, or the like.

The diffusion preventing films 200 are disposed so as to sandwich the respective interlayer films 100, reduces surface diffusion of the metal forming the wiring lines 300, and functions as stoppers when the layers thereon are processed. Specifically, the diffusion preventing films 200 are formed with an insulating material having a higher etching resistance (an etching resistance to a fluorine compound, for example) than the interlayer films 100, and may be formed with an insulating material such as $SiN_x$, SiCN, SiON, or SiC, for example.

Note that the materials forming the interlayer films 100 and the diffusion preventing films 200 are only required to be selected so as to increase the etching selectivity for the interlayer films 100 with respect to the diffusion preventing films 200, and various combinations are possible. Therefore, the materials forming the interlayer films 100 and the diffusion preventing films 200 are not limited to the materials described above, and a combination of other materials can be used.

The wiring lines 300 transmit current or voltage between active elements or passive elements provided in the semiconductor device 1. The wiring lines 300 are formed with a conductive material, and may be formed with a first metal, an alloy of the first metal, or the like. The first metal is an easy-to-process metal having a low resistance, such as copper (Cu), aluminum (Al), cobalt (Co), or an alloy of these metals (such as CoWB), for example. In a case where the wiring lines 300 are formed with Cu, the wiring lines 300 can be easily formed by using a damascene technique or the like. Further, in a case where the wiring lines 300 are formed with Al, the wiring lines 300 can be easily formed by dry etching with a halogen gas.

The through vias 400 electrically connect the wiring lines 300 formed in the different interlayer films 100 to one another. Specifically, the second through via 420 electrically connects the first wiring lines 310 and the second wiring lines 320, and the third through via 430 electrically connects the second wiring lines 320 and the third wiring lines 330. The through vias 400 are formed with a conductive material, and may be formed with a first metal or an alloy of the first metal, like the wiring lines 300. For example, the through vias 400 may be formed with copper (Cu), aluminum (Al), cobalt (Co), an alloy of these metals (such as CoWB), or the like.

The via insulating layer 600 is formed with an insulating material on one surface of the multilayer wiring layer 101, and electrically insulates each of the contact vias 610. Like the interlayer films 100, the via insulating layer 600 may be formed with an insulating material on which etching can be relatively easily performed (specifically, on which etching is easily performed than on the diffusion preventing films 200). The via insulating layer 600 may be formed with an insulating material such as $SiO_2$, for example, or may be formed with an organic resin, a low-k material such as carbon-doped $SiO_2$ or porous silica, or the like.

The contact vias 610 penetrate the via insulating layer 600 and the first diffusion preventing film 210, are formed to protrude into the first interlayer film 110, and electrically connect the semiconductor substrate (not shown) and the first wiring lines 310. Specifically, the contact vias 610 electrically connect the first wiring lines 310 to the semiconductor substrate (not shown) formed on the other surface of the via insulating layer 600 on which the multilayer wiring layer 101 is formed, or electrodes or the like formed on the semiconductor substrate. For example, the contact vias 610 may be formed with a conductive material, and may be formed with a second metal or an alloy of the second metal that is different from the first metal forming the wiring lines 300 and the like. The second metal is a metal that has characteristics such as less diffusion of metal atoms into the semiconductor substrate, higher burying properties at the time of formation of the contact vias 610, and a higher heat resistance. The metal may be tungsten (W) or the like, for example.

Note that the contact vias 610 may be formed in a floating state in the via insulating layer 600 and the first interlayer film 110, to secure the mechanical strength of the semiconductor device 1. In such a case, the contact vias 610 function as columnar members that are supports between the layers of the semiconductor device 1.

The zeroth wiring line 620 is formed inside the first interlayer film 110 and on the first diffusion preventing film 210, and electrically connects active elements or passive elements provided in the semiconductor device 1 to the contact vias 610. The zeroth wiring line 620 is formed with a conductive material, and may be formed with a second metal or an alloy of the second metal, like the contact vias 610. For example, the zeroth wiring line 620 may be formed with tungsten (W), a tungsten alloy, or the like.

Since the contact vias 610 and the zeroth wiring line 620 are disposed at positions closer to the semiconductor substrate than the wiring lines 300, the contact vias 610 and the zeroth wiring line 620 can be formed with the second metal having less influence on the semiconductor substrate than the first metal. In a case where the contact vias 610 and the zeroth wiring line 620 are formed with the second metal, a barrier metal layer formed with a metal having high barrier properties against atoms may be formed on the surfaces of the contact vias 610 and the zeroth wiring line 620. The barrier metal layer may be formed with a metal such as tantalum (Ta), titanium (Ti), ruthenium (Ru), cobalt (Co) or manganese (Mn), or a nitride or an oxide of these metals, for example.

However, the barrier metal layer may be damaged at the time of etching for forming the air gap 530 described later. Therefore, in a case where the barrier metal layer is formed on the surfaces of the contact vias 610 and the zeroth wiring line 620, a protective film formed with a material similar to that of the diffusion preventing films 200 may be provided to further cover the barrier metal layer.

The semiconductor device 1 according to this embodiment further includes a through hole 510, a protective sidewall 520, and an air gap 530. The air gap 530 is formed in the first interlayer film 110 and the second interlayer film 120 so as to expose the contact vias 610. The through hole 510 is formed to penetrate the fourth diffusion preventing film 240, the third interlayer film 130, and the third diffusion preventing film 230, and connects the air gap 530 to the external space. The protective sidewall 520 is formed on the side surface inside the through hole 510.

Note that, although not shown in FIG. 1, a sealing layer for covering the opening formed by the through hole 510 may be disposed on the fourth diffusion preventing film 240. The sealing layer is formed with an inorganic insulating material such as $SiO_x$, $SiN_x$, SiCN, SiON, or SiC, or an organic resin, for example, and can prevent entry of moisture and the like into the through hole 510 and the air gap 530.

The through hole 510 is formed to penetrate the interlayer films 100 disposed on the other surface of the multilayer wiring layer 101 opposite from the surface provided with the via insulating layer 600, and the diffusion preventing films 200 sandwiching the interlayer films 100. Specifically, the through hole 510 is formed to penetrate the third interlayer film 130, and the third and fourth diffusion preventing films 230 and 240 sandwiching the third interlayer film 130. The opening of the through hole 510 may be formed in any appropriate planar shape. For example, the opening of the through hole 510 may be formed in a substantially square shape having a side of at least 50 nm to 300 nm, or a substantially circular shape having a diameter of at least 50 nm to 300 nm.

The protective sidewall 520 is formed on the side surface inside the through hole 510, and protects the side surface of the third interlayer film 130 exposed by the through hole 510. The protective sidewalls 520 is formed with an insulating material having a higher etching resistance (an etching resistance to a fluorine compound, for example) than the interlayer films 100, for example, and may be formed with an insulating material such as $SiN_x$, SiCN, SiON, SiOC, or SiC, for example. Alternatively, the protective sidewall 520 may be formed with a high-k material such as aluminum oxide ($Al_2O_3$), titanium oxide ($TiO_2$), ditantalum pentoxide ($Ta_2O_5$), hafnium oxide ($HfO_2$), zircon oxide ($ZrO_2$), or lanthanum oxide ($La_2O_3$), or may be formed with a metallic material. Note that, in a case where the protective sidewall 520 is formed with a metallic material, the protective sidewall 520 is formed to be in a floating state.

The protective sidewall 520 functions to protect the third interlayer film 130 from etching when the air gap 530 is formed. Specifically, the air gap 530 is formed by introducing an etching solution or an etching vapor via the through hole 510 and performing etching (wet etching or vapor etching) on the first interlayer film 110 and the second interlayer film 120. At this point of time, the protective sidewall 520 protects the third interlayer film 130 from the etching with the etching solution or the etching vapor. As the through hole 510 having the inner side surface covered with the protective sidewall 520 as described above, the semiconductor device 1 can form the air gap 530 in the interlayer films 100 inside the multilayer wiring layer 101. Note that the protective sidewall 520 may be a thin film having a thickness of 5 nm to 30 nm, for example.

The air gap 530 is formed in at least one of the interlayer films 100 of the multilayer wiring layer 101 so as to expose the contact vias 610, and the space between the respective contact vias 610 or the respective wiring lines 300 is a hollow space having a relative dielectric constant of 1. Specifically, the air gap 530 is formed in the first interlayer film 110 and the second interlayer film 120, and each space among part of the contact vias 610, the first wiring lines 310, and the second wiring lines 320 is a hollow space. With this arrangement, the air gap 530 can reduce the parasitic capacitance formed between the respective contact vias 610 or the respective wiring lines 300.

In the semiconductor device 1 according to this embodiment, the air gap 530 is formed in the first interlayer film 110, to expose at least the contact vias 610. With this configuration, the semiconductor device 1 can reduce the capacitance between the wiring lines in the region close to the semiconductor substrate on which transistors and the like are formed. Thus, the basic performance of the semiconductor device 1, such as signal conversion efficiency and switching characteristics, can be improved.

Note that the air gap 530 can be formed by introducing an etching solution or an etching vapor via the through hole 510 and performing etching on the first interlayer film 110 and the second interlayer film 120, using wet etching or vapor etching, for example.

At this stage, the region in which the air gap 530 is formed in the stacking direction of the multilayer wiring layer 101 is limited to the region surrounded by the diffusion preventing films 200. This is because the diffusion preventing films 200 have a higher etching resistance than the interlayer films 100, and the etching hardly progresses. Further, the region in which the air gap 530 is formed in the in-plane direction of the multilayer wiring layer 101 is controlled with the etching amount. Specifically, the etching solution or the etching vapor introduced from the through hole 510 isotropically spreads from immediately below the through hole 510, so that etching is performed on the interlayer films 100. Thus, the region in the in-plane direction of the air gap 530 can be controlled with the etching amount.

Note that the etching of the interlayer films 100 is performed under the condition that etching is not performed on the contact vias 610, the through vias 400, and the wiring lines 300. Therefore, in a case where the contact vias 610, the through vias 400, or the wiring lines 300 exist in the region in which the air gap 530 is to be formed, these components remain in the air gap 530 without any change. Further, in a case where the interlayer films 100 are spatially partitioned by the contact vias 610, the through vias 400, or the wiring lines 300, entry of the etching solution or the etching vapor is blocked by these components, and the region in which the air gap 530 is to be formed is limited.

Here, in a case where the air gap 530 is formed in a plurality of interlayer films 100, an opening is formed in the diffusion preventing films 200 in the plurality of interlayer films 100. Specifically, in a case where the air gap 530 is formed in the first interlayer film 110 and the second interlayer film 120, an opening is formed in the second diffusion preventing film 220 between the first interlayer film 110 and the second interlayer film 120. Accordingly, when the etching solution or the etching vapor is introduced from through hole 510, the etching solution or the etching vapor diffuses from second interlayer film 120 to the first interlayer film 110 via the opening. Thus, the air gap 530 is formed over the plurality of interlayer films 100.

At this stage, the opening in the diffusion preventing films 200 is formed so as to protrude into the air gap 530 and not to leave a region without the hole on the wiring lines 300. Thus, the diffusion preventing films 200 protruding into the air gap 530 can be prevented from collapsing after the air gap 530 is formed.

Although FIG. 1 shows a case where only one through hole 510 is formed, the technology according to the present disclosure is not limited to the example described above. For example, a plurality of through holes 510 may be formed. In such a case, the plurality of through holes 510 may form the same air gap 530, or each of the through holes 510 may form different air gaps 530 from one another.

In the semiconductor device 1 described above, each space between the wiring lines 300 can be made hollow with the air gap 530, and thus, the capacitance between the wiring lines can be reduced. Accordingly, the semiconductor device 1 can achieve higher-speed operation and lower power consumption by reducing delays in the wiring lines 300. Further, in the semiconductor device 1, no diffusion preventing films 200 protrude into the air gap 530. Thus, the diffusion preventing films 200 having a low mechanical strength can be prevented from collapsing.

(1.2. Manufacturing Method)

Referring now to FIGS. 2A, 2B, 2C, 2D, 2E, 2F, and 2G, a method for manufacturing the semiconductor device 1 according to this embodiment is described. FIGS. 2A, 2B, 2C, 2D, 2E, 2F, and 2G are cross-sectional views each illustrating a step in the method for manufacturing the semiconductor device 1 according to this embodiment.

First, as shown in FIG. 2A, the via insulating layer 600, the first diffusion preventing film 210, the first interlayer film 110, and the second diffusion preventing film 220 are sequentially stacked on a semiconductor substrate (not shown) by chemical vapor deposition (CVD). Further, the contact vias 610 are formed in the via insulating layer 600, and the zeroth wiring line 620 and the first wiring lines 310 are formed in the first interlayer film 110.

Specifically, the via insulating layer 600 is first formed on a semiconductor substrate (not shown) including silicon (Si) or the like by CVD. Next, after the first diffusion preventing film 210 is formed on the via insulating layer 600 by CVD, the via insulating layer 600 and the first diffusion preventing film 210 in predetermined regions are removed by etching. After a barrier metal layer such as a titanium nitride (TiN) layer is formed by a sputtering technique in the openings formed by the etching, tungsten (W) is buried in the openings, to form the contact vias 610 and the zeroth wiring line 620.

After the first interlayer film 110 is formed on the first diffusion preventing film 210 by CVD, the first interlayer film 110 in predetermined regions is removed by etching, and the resultant openings are filled with copper (Cu) or the like by a damascene technique, so that the first wiring lines 310 are formed. After that, the second diffusion preventing film 220 is formed on the entire surface of the first interlayer film 110 and over the first wiring lines 310 by CVD.

Note that the via insulating layer 600 and the first interlayer film 110 may be formed with $SiO_x$ or the like, on which etching with hydrofluoric acid is easily performed, and the first diffusion preventing film 210 and the second diffusion preventing film 220 may be formed with SiC or the like having a high etching resistance to hydrofluoric acid.

Next, as shown in FIG. 2B, part of the second diffusion preventing film 220 is removed by a photolithography technique or the like, so that an opening 530A is formed. The opening 530A functions as the opening for introducing an etching solution from the second interlayer film 120 to the first interlayer film 110 in the process of forming the air gap 530 at a later stage.

As shown in FIG. 2C, the second interlayer film 120, the third diffusion preventing film 230, the third interlayer film 130, and the fourth diffusion preventing film 240 are sequentially stacked on the second diffusion preventing film 220 by CVD. Further, the second wiring lines 320 and the second through via 420 are formed in the second interlayer film 120, and the third wiring lines 330 and the third through via 430 are formed in the third interlayer film 130.

Specifically, after the second interlayer film 120 is formed on the second diffusion preventing film 220 by CVD, the second interlayer film 120 in predetermined regions is removed by etching, and the resultant openings are filled with copper (Cu) or the like by a damascene technique, so that the second wiring lines 320 and the second through via 420 are formed. Likewise, the third diffusion preventing film 230 and the third interlayer film 130 are then formed on the second wiring lines 320 and the second interlayer film 120 by CVD. The third interlayer film 130 in predetermined regions is then removed by etching, and the resultant openings are filled with copper (Cu) or the like by a damascene technique, so that the third wiring lines 330 and the third through via 430 are formed. After that, the fourth diffusion preventing film 240 is formed on the third wiring lines 330 and the third interlayer film 130 by CVD.

Note that the second interlayer film 120 and the third interlayer film 130 may be formed with $SiO_x$ or the like, on which etching with hydrofluoric acid is easily performed, and the third diffusion preventing film 230 and the fourth diffusion preventing film 240 may be formed with SiC or the like having a high etching resistance to hydrofluoric acid.

Figure 2D:
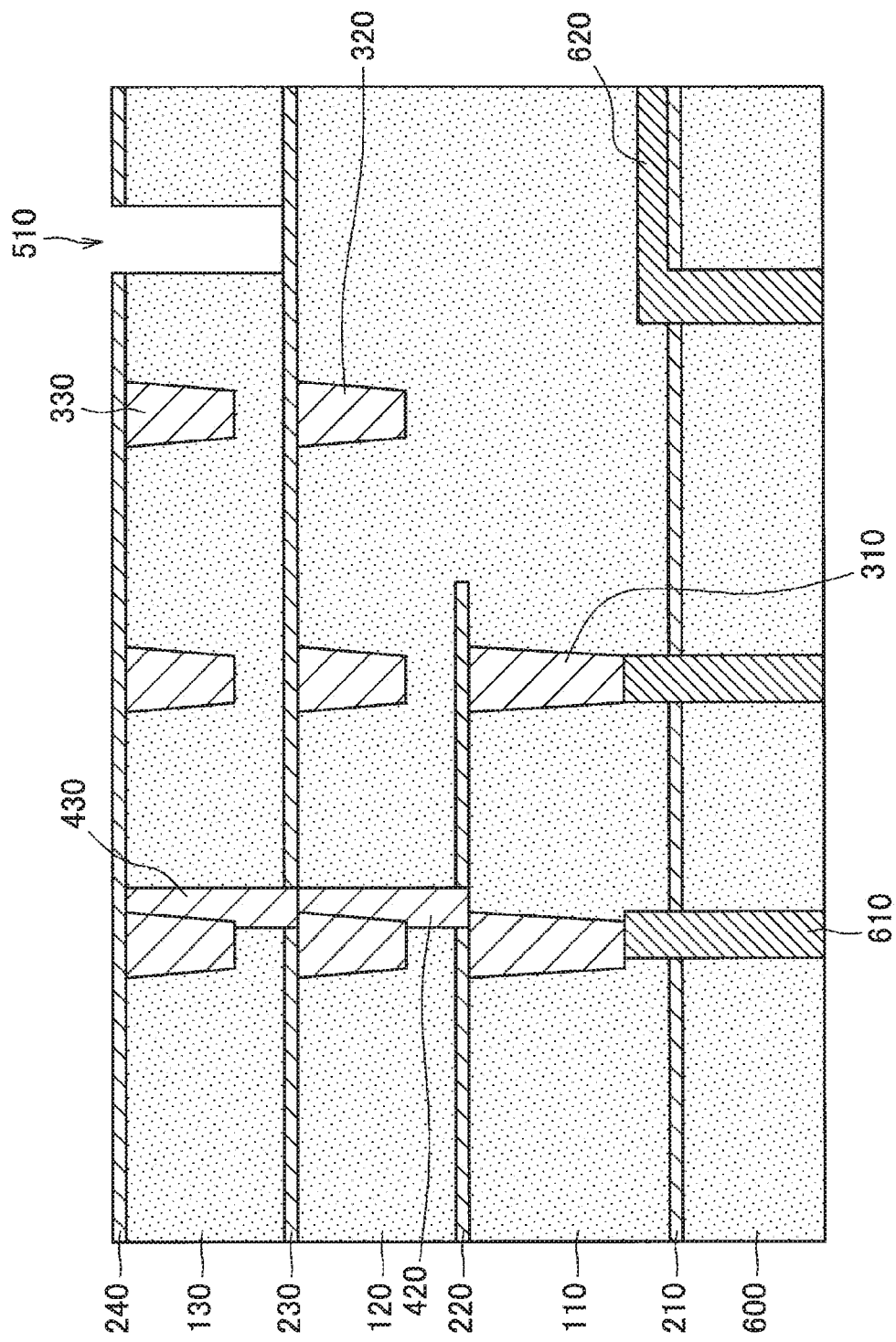
FIG. 2D is a cross-sectional view illustrating a step in the method for manufacturing the semiconductor device according to the embodiment.

Next, as shown in FIG. 2D, the fourth diffusion preventing film 240 and the third interlayer film 130 in a region are removed by etching or the like, so that the through hole 510 for exposing the third diffusion preventing film 230 is formed. Note that the region in which the through hole 510 is formed is the region in which the second wiring lines 320 and the third wiring lines 330 are not formed, for example. The planar shape of the opening of the through hole 510 may be a square having a side of 50 nm to 300 nm, for example. Note that a plurality of through holes 510 may of course be formed.

Figure 2E:
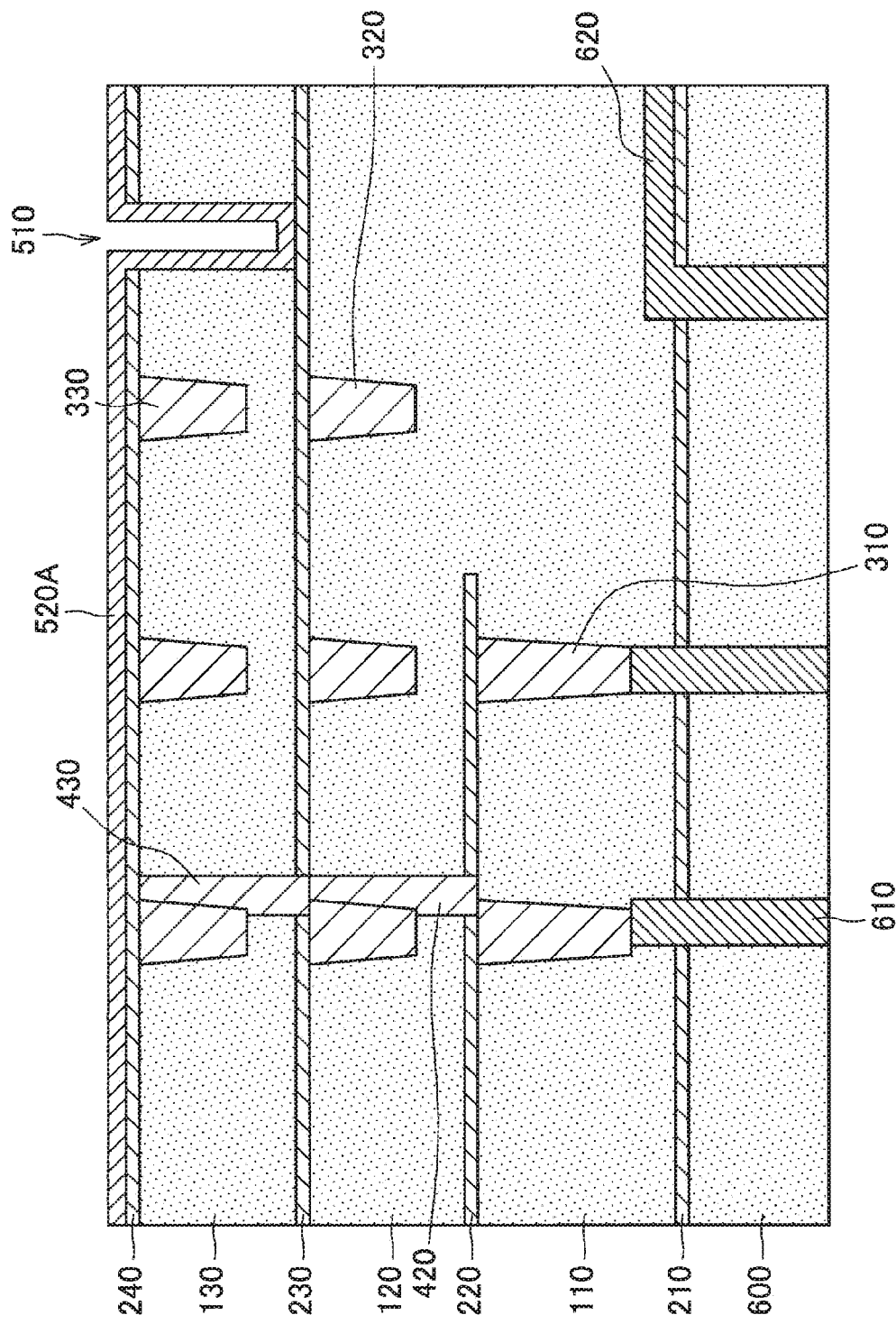
FIG. 2E is a cross-sectional view illustrating a step in the method for manufacturing the semiconductor device according to the embodiment.

As shown in FIG. 2E, a protective film 520A is then formed on the fourth diffusion preventing film 240 and on the side surface in the through hole 510 by atomic layer deposition (ALD). The protective film 520A may be formed with SiC or the like, which has a high etching resistance to hydrofluoric acid and is capable of secure a sufficient etching selectivity with respect to the interlayer films 100, for example, and the protective film 520A may have a thickness of 5 nm to 30 nm. Note that, being formed by ALD, the protective film 520A is uniformly (conformally) formed on the fourth diffusion preventing film 240 and on the side surface in the through hole 510.

Next, as shown in FIG. 2F, etchback is performed on the entire surface of the protective film 520A, so that the protective film 520A formed on the fourth diffusion preventing film 240 and the third diffusion preventing film 230 is removed, and the fourth diffusion preventing film 240 and the second interlayer film 120 are exposed.

The etchback on the entire surface is to perform etching with high perpendicular anisotropy, to remove the protective film 520A formed on the fourth diffusion preventing film 240 and the third diffusion preventing film 230 while leaving the protective film 520A formed inside the through hole 510. As a result, the protective sidewall 520 covering the inner side surface of the through hole 510 is formed. As the fourth diffusion preventing film 240 is formed on the third interlayer film 130, the protective sidewall 520 can be formed without any damage being caused to the third interlayer film 130 by the etchback on the entire surface.

Figure 2G:
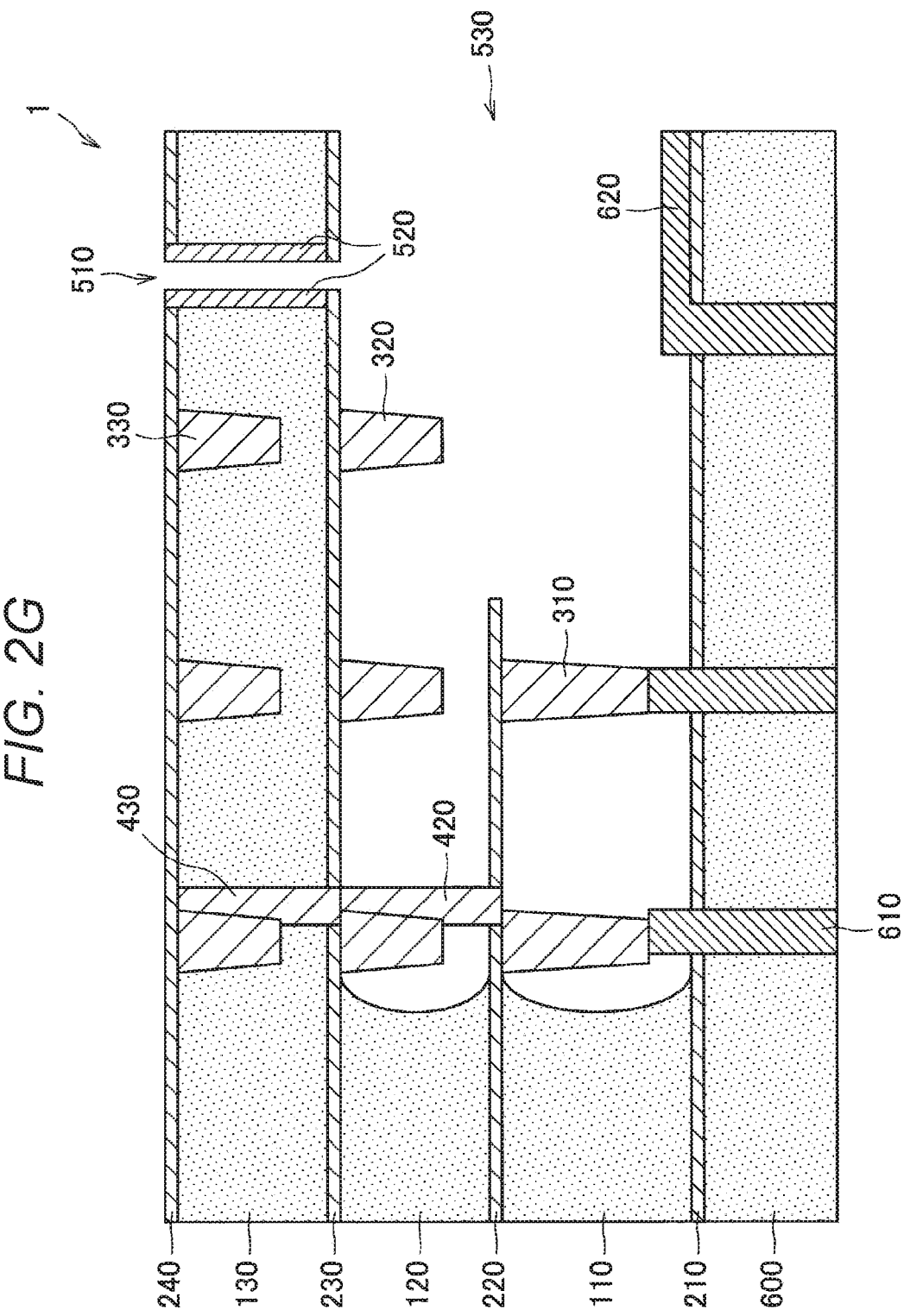
FIG. 2G is a cross-sectional view illustrating a step in the method for manufacturing the semiconductor device according to the embodiment.

As shown in FIG. 2G, etching is then performed by introducing a solution or a vapor of dilute hydrofluoric acid into the second interlayer film 120 and the first interlayer film 110 via the through hole 510. Thus, the air gap 530 is formed.

Since the protective sidewall 520 and the first through fourth diffusion preventing films 210, 220, 230, and 240 are formed with SiC or the like having a high etching resistance to hydrofluoric acid, the etching hardly progresses at this stage. Further, the contact vias 610, the zeroth wiring line 620, the first and second wiring lines 310 and 320, and the second through via 420 are formed with a metallic material such as copper (Cu) or tungsten (W), and have a high etching resistance to hydrofluoric acid. Thus, the etching hardly progresses. Thus, only the first interlayer film 110 and the second interlayer film 120 can be removed by the etching, and the air gap 530 can be formed.

Therefore, the region in which the air gap 530 is to be formed in the stacking direction of the semiconductor device 1 is limited to the region sandwiched between the first diffusion preventing film 220 and the third diffusion preventing film 230. Further, the region in which the air gap 530 is to be formed in the in-plane direction of the semiconductor device 1 is controlled with the etching amount. However, in a case where the contact vias 610, the zeroth wiring line 620, the first and second wiring lines 310 and 320, and the second through via 420 are formed like walls surrounding a predetermined region, the region in which the air gap 530 is to be formed may be limited to the predetermined region surrounded by these components. In this manner, the semiconductor device 1 can have the air gap 530 formed only in the region in which the capacitance between wiring lines is to be reduced.

Note that the second diffusion preventing film 220 is formed in the region having its end in a region having a first wiring line 310 formed therein, and does not protrude into the air gap 530. Thus, in the semiconductor device 1, it is possible to prevent the second diffusion preventing film 220 from collapsing after the air gap 530 is formed.

Through the above steps, the semiconductor device 1 according to this embodiment can be manufactured. Note that, to prevent entry of moisture and the like into the air gap 530, a sealing layer formed with an insulating material may be formed on the fourth diffusion preventing film 240 to close the opening of the through hole 510.

By the manufacturing method described above, hydrofluoric acid is used in the etching, the interlayer films 100 are formed with $SiO_x$ as a material on which etching with hydrofluoric acid is easily performed, and the diffusion preventing films 200 are formed with SiC having a higher etching resistance to the hydrofluoric acid. However, the technology according to the present disclosure is not limited to the example described above. The combination of the materials to be used for the interlayer films 100 and the diffusion preventing films 200 may be a combination of any appropriate materials, as long as a sufficient etching selectivity with respect to the diffusion preventing films 200 can be secured for the interlayer films 100.

(1.3. Modifications)

Figure 3:
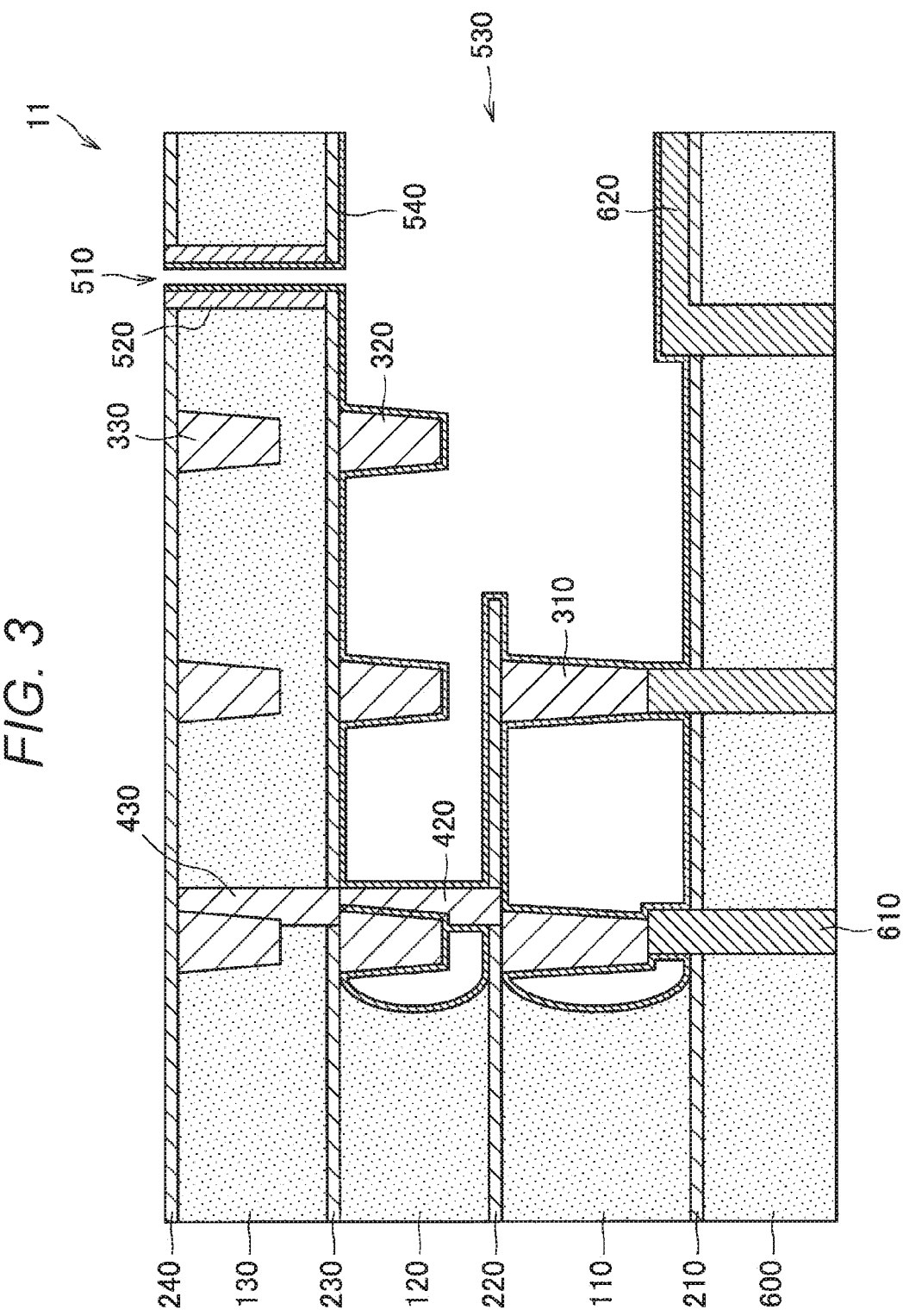
FIG. 3 is a cross-sectional view of a semiconductor device according to a first modification of the embodiment, taken in the stacking direction.
Figure 4:
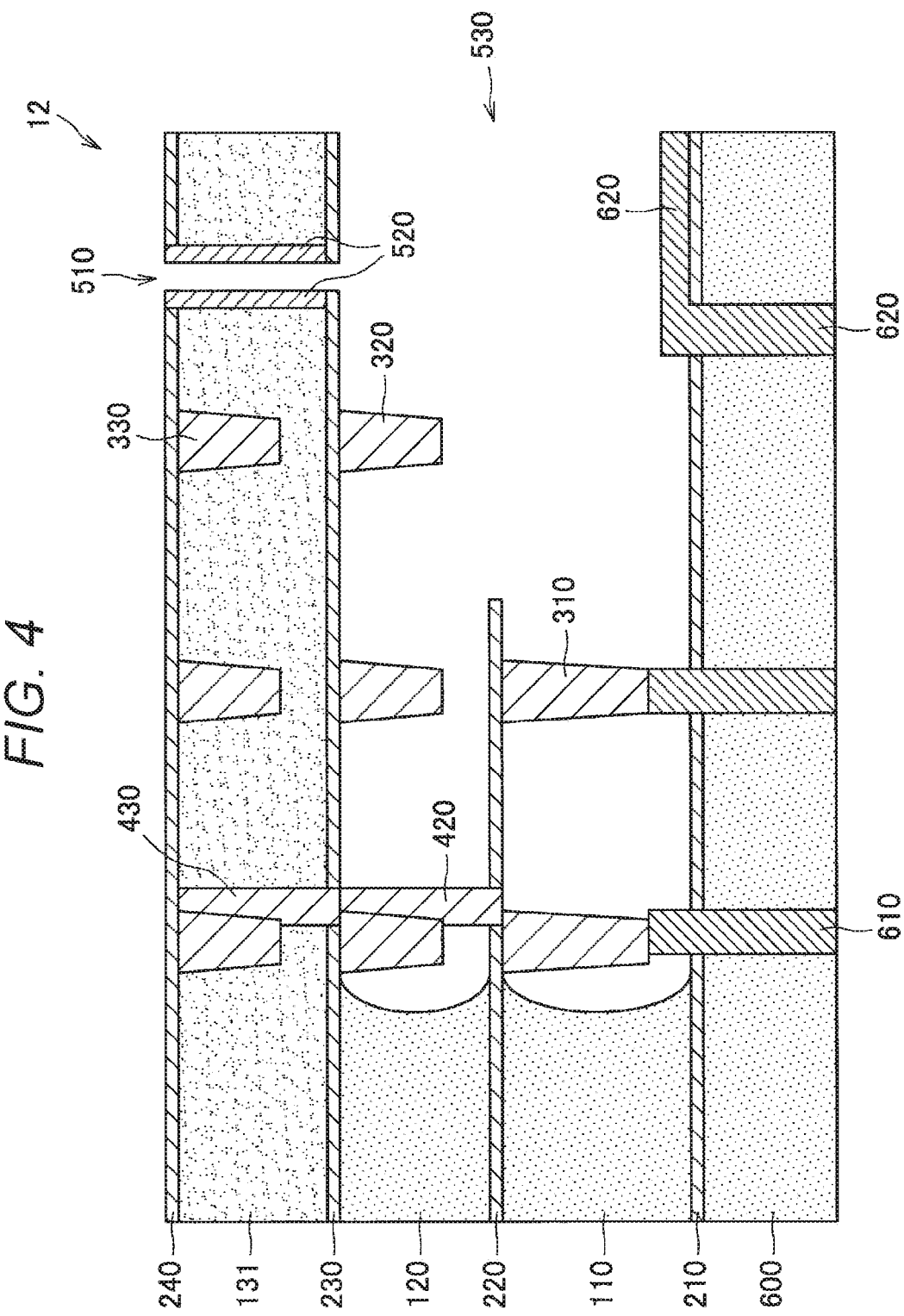
FIG. 4 is a cross-sectional view of a semiconductor device according to a second modification of the embodiment, taken in the stacking direction.
Figure 5B:
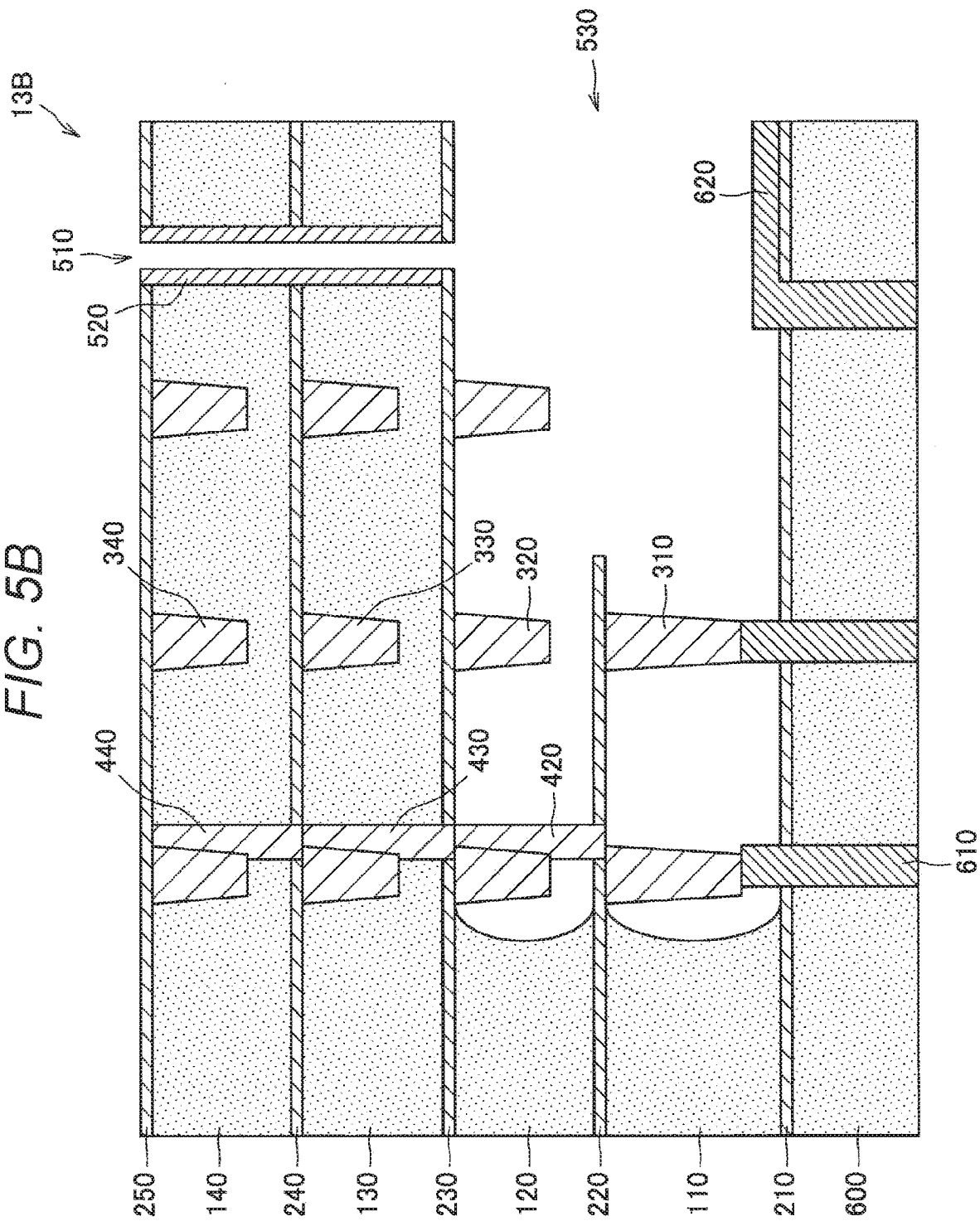
FIG. 5B is a cross-sectional view of a semiconductor device according to the third modification of the embodiment, taken in the stacking direction.
Figure 6:
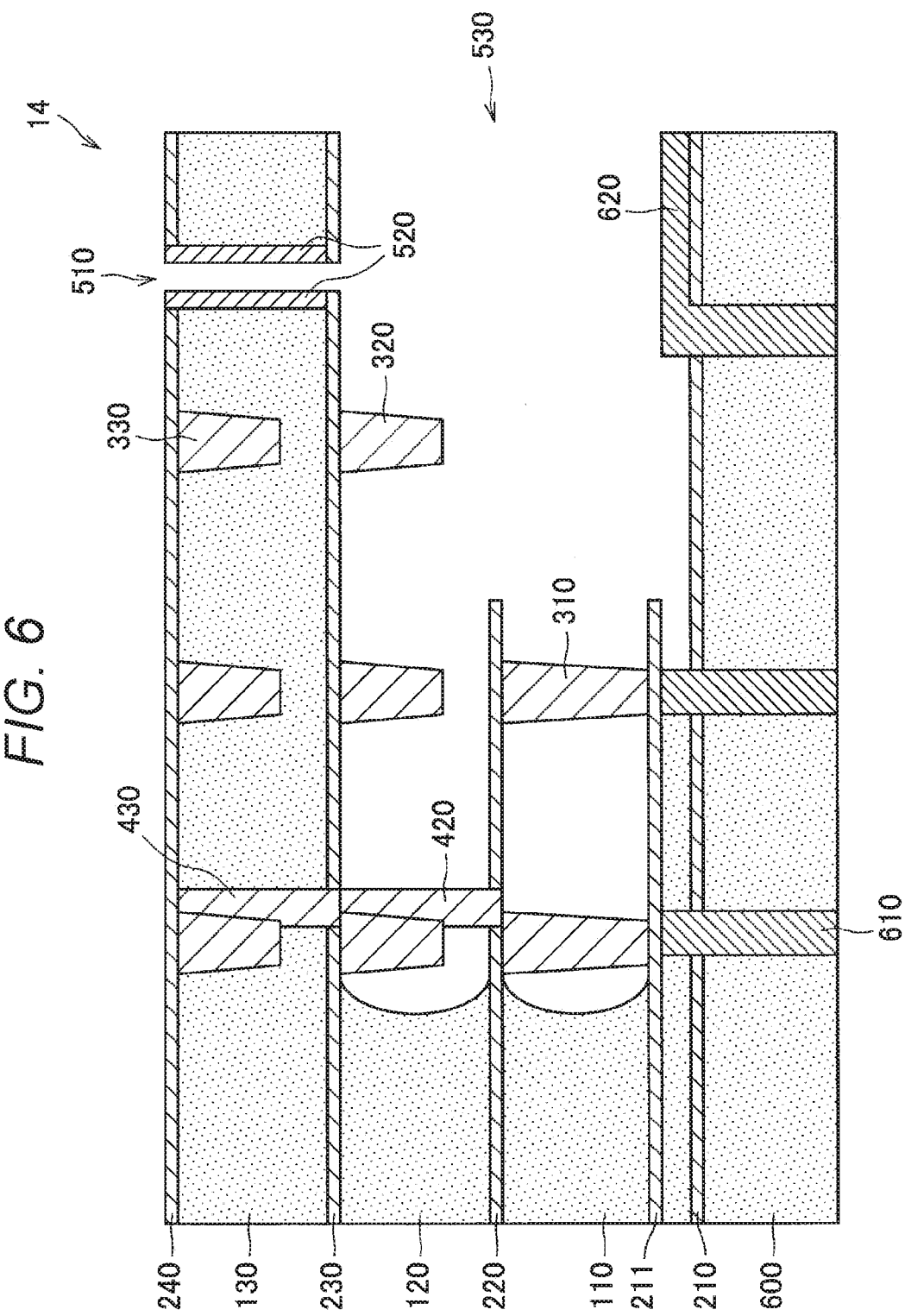
FIG. 6 is a cross-sectional view of a semiconductor device according to a fourth modification of the embodiment, taken in the stacking direction.

Next, modifications of the semiconductor device 1 according to this embodiment are described, with reference to FIGS. 3, 4, 5A, 5B, 5C, and 6. FIG. 3 is a cross-sectional view of a semiconductor device 11 according to a first modification, taken in the stacking direction. FIG. 4 is a cross-sectional view of a semiconductor device 12 according to a second modification, taken in the stacking direction. FIGS. 5A, 5B, and 5C are cross-sectional views of semiconductor devices 13A through 13C according to a third modification, taken in the stacking direction. FIG. 6 is a cross-sectional view of a semiconductor device 14 according to a fourth modification, taken in the stacking direction. Note that FIGS. 3, 4, 5A, 5B, 5C, and 6 each show part of a cross-section of a semiconductor device, and the semiconductor device of course extends to regions that are not shown in the drawings.

(First Modification)

As shown in FIG. 3, in the semiconductor device 11 according to the first modification, a protective film 540 may be formed on the surface exposed by the air gap 530. Specifically, the protective film 540 may be formed on the respective surfaces of the contact vias 610, the zeroth wiring line 620, the interlayer films 100, the diffusion preventing films 200, the wiring lines 300, and the through vias 400 exposed by the air gap 530. Note that the other components are the same as those described with reference to FIG. 1, and therefore, explanation of them is not made herein.

The protective film 540 is formed with any appropriate insulating material, for example, and may be formed with an insulating material such as $SiO_x$, $SiN_x$, SiCN, SiON, SiOC, or SiC, for example. The thickness of the protective film 540 may be 2 nm to 50 nm, for example. The protective film 540 can improve wiring reliability by preventing electromigration and time-dependent dielectric breakdown (TDDB) in the wiring lines 300 and the through vias 400. It is possible to form such a protective film 540 by introducing a source gas into the air gap 530 via the through hole 510 and performing ALD, for example.

(Second Modification)

Next, as shown in FIG. 4, in the semiconductor device 12 according to the second modification, the interlayer films 100 may be formed with a plurality of different materials. Specifically, the via insulating layer 600, the first interlayer film 110, and the second interlayer film 120 may be formed with a first material, and a third interlayer film 131 may be formed with a second material different from the first material. For example, the via insulating layer 600, the first interlayer film 110, and the second interlayer film 120 may be formed with a first material such as $SiO_x$, and the third interlayer film 131 may be formed with a second material having a lower relative dielectric constant than $SiO_x$ of the first material (this second material is a so-called low-k material described above). Note that the other components are the same as those described with reference to FIG. 1, and therefore, explanation of them is not made herein.

The air gap 530 is formed in the interlayer films 100 formed with the first material having a higher relative dielectric constant than the second material, so that the parasitic capacitance formed between the wiring lines 300 can be effectively reduced. However, it goes without saying that the air gap 530 may be formed in the interlayer film(s) 100 formed with a second material having a higher relative dielectric constant than the first material.

Further, in a case where a combination of the first material and the second material is selected so that the etching selectivity of the first material with respect to the second material (the so-called low-k material described above) becomes higher, the air gap 530 can be formed even if the protective sidewall 520 is not formed. Specifically, as etching is not performed on the third interlayer film 131 formed with the second material during the etching for forming the air gap 530, it becomes possible to form the air gap 530 without forming the protective sidewall 520.

(Third Modification)

Next, as shown in FIGS. 5A, 5B, and 5C, in the semiconductor devices 13A through 13C according to the third modification, four or more interlayer films 100 and four or more diffusion preventing films 200 may be stacked, and the air gap 530 may be formed in one to three interlayer films 100.

Here, a fourth interlayer film 140 may be formed with a material similar to that of the first through third interlayer films 110, 120, and 130. A fifth diffusion preventing film 250 may be formed with a material similar to that of the first through fourth diffusion preventing films 210, 220, 230, and 240. Fourth wiring lines 340 may be formed with a material similar to that of the first through third wiring lines 310, 320, and 330. A fourth through via 440 may be formed with a material similar to that of the second and third through vias 420 and 430. Further, the other components are the same as those described with reference to FIG. 1, and therefore, explanation of them is not made herein.

As shown in FIG. 5A, the air gap 530 may be formed in a single interlayer film 100. Specifically, the air gap 530 may be formed in the first interlayer film 110. In such a case, the through hole 510 is formed to penetrate the second through fifth diffusion preventing films 220, 230, 240, and 250, and the second through fourth interlayer films 120, 130, and 140.

Alternatively, as shown in FIG. 5B, the air gap 530 may be formed in two interlayer films 100. Specifically, the air gap 530 may be formed in the first interlayer film 110 and the second interlayer film 120. In such a case, the through hole 510 is formed to penetrate the third through fifth diffusion preventing films 230, 240, and 250, and the third and fourth interlayer films 130 and 140.

Further, as shown in FIG. 5C, the air gap 530 may be formed in three interlayer films 100. Specifically, the air gap 530 may be formed in the first interlayer film 110, the second interlayer film 120, and the third interlayer film 130. In such a case, the through hole 510 is formed to penetrate the fourth and fifth diffusion preventing films 240 and 250, and the fourth interlayer film 140.

However, in any of the cases with the semiconductor devices 13A through 13C according to this modification, the air gap 530 is formed at least in the first interlayer film 110, to expose the contact vias 610 and the zeroth wiring line 620. With this configuration, the semiconductor devices 13A through 13C can reduce the capacitance between the wiring lines in the region close to the semiconductor substrate on which transistors and the like are formed. Thus, the basic performance of the semiconductor device 1, such as signal conversion efficiency and switching characteristics, can be improved.

Note that the number of stacked layers that are the interlayer films 100 and the diffusion preventing films 200 in the semiconductor device 1 according to this embodiment is not limited to any particular number. That is, the multilayer wiring layer 101 may be formed by stacking six or more interlayer films 100 and six or more diffusion preventing films 200. The larger the number of the interlayer films 100 in which the air gap 530 is formed, the more the capacitance between wiring lines in the entire semiconductor device 1 can be reduced. However, the smaller the number of the interlayer films 100 in which the air gap 530 is formed, the more the mechanical strength can be maintained in the entire semiconductor device 1. Therefore, the number of the interlayer films 100 in which the air gap 530 is to be formed may be adjusted as appropriate, with the balance between the inter-wire capacitance and the mechanical strength being taken into consideration.

(Fourth Modification)

Further, as shown in FIG. 6, in the semiconductor device 14 according to the fourth modification, a diffusion preventing film 211 may be further formed in the first interlayer film 110. Specifically, the diffusion preventing film 211 may be further formed between the first wiring lines 310 and the contact vias 610 in the first interlayer film 110.

Note that the diffusion preventing film 211 may be formed with a material similar to that of the first through fourth diffusion preventing films 210, 220, 230, and 240. Further, the other components are the same as those described with reference to FIG. 1, and therefore, explanation of them is not made herein.

In this configuration, the region in which the air gap 530 is to be formed can be controlled in a finer manner with the diffusion preventing film 211. For example, it is possible to change the planar region in which the air gap 530 is to be formed between the first wiring lines 310 and the contact vias 610.

2. Second Embodiment (2.1. Example Configuration)

Figure 7:
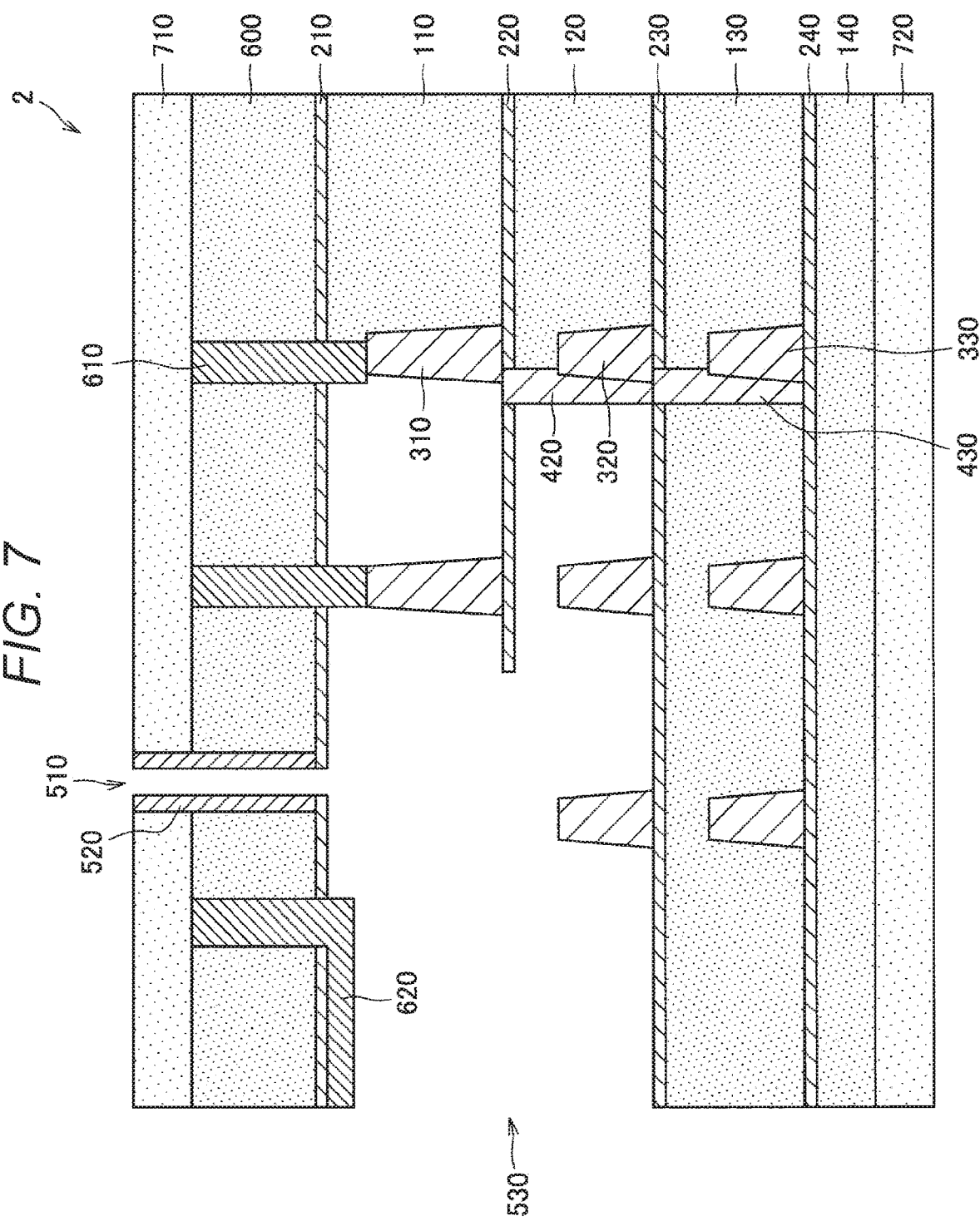
FIG. 7 is a cross-sectional view of a semiconductor device according to a second embodiment of the present disclosure, taken in the stacking direction.

Referring now to FIG. 7, the configuration of a semiconductor device 2 according to a second embodiment of the present disclosure is described. FIG. 7 is a cross-sectional view of a semiconductor device according to this embodiment, taken in the stacking direction. Note that FIG. 7 shows part of a cross-section of the semiconductor device 2 according to this embodiment, and the semiconductor device 2 of course extends to regions that are not shown in the drawing.

As shown in FIG. 7, in the semiconductor device 2, a multilayer wiring layer 101 in which interlayer films 100 and diffusion preventing films 200 are alternately stacked is interposed between a pair of substrates 710 and 720, and a through hole 510 is formed to generate the substrate 710 and a via insulating layer 600.

Here, a fourth interlayer film 140 may be formed with a material similar to that of the first through third interlayer films 110, 120, and 130. Further, the other components are the same as those described with reference to FIG. 1, and therefore, explanation of them is not made herein.

In the semiconductor device 2 according to this embodiment, the multilayer wiring layer 101 in which the interlayer films 100 and the diffusion preventing films 200 are alternately stacked is interposed between the pair of substrates 710 and 720, so that the mechanical strength of the entire semiconductor device 2 can be increased.

The substrate 710 is a semiconductor substrate, and may be a silicon (Si) substrate, for example. Specifically, the substrate 710 is a substrate in which various passive elements or active elements for realizing the principal functions of the semiconductor device 1 are disposed. For example, a memory circuit, a logic circuit, an amplifier circuit, a color sensor, or the like may be disposed in the substrate 710.

A substrate of any material can be used as the substrate 720, as long as the multilayer wiring layer 101 in which the interlayer films 100 and the diffusion preventing films 200 are alternately stacked can be joined thereto. The substrate 720 may be a glass substrate such as quartz, a resin substrate such as polyimide or polyester, or a semiconductor substrate such as silicon (Si), for example.

Further, the substrates 710 and 720 may be reduced in thickness by chemical mechanical polishing (CMP) or the like. The semiconductor device 2 according to this embodiment can maintain the mechanical strength as a whole even in a case where the air gap 530 is formed. Thus, a sufficient mechanical strength can be maintained even in a case where the substrates 710 and 720 are reduced in thickness.

As shown in the semiconductor device 2 according to this embodiment, the through holes 510 may be formed from any surface of the multilayer wiring layer 101 in which the interlayer films 100 and the diffusion preventing films 200 are alternately stacked. That is, the through hole 510 may be formed from the side of the fourth interlayer film 140, or may be formed from the side of the first interlayer film 110 (which is the side of the via insulating layer 600). In either case, in the semiconductor device 2, the air gap 530 that exposes the contact vias 610 or the zeroth wiring line 620 can be formed in the multilayer wiring layer 101, via the through hole 510 as in the first embodiment.

(2.2. Manufacturing Method)

Referring now to FIGS. 8A, 8B, 8C, 8D, and 8E, a method for manufacturing the semiconductor device 2 according to this embodiment is described. FIGS. 8A, 8B, 8C, 8D, and 8E are cross-sectional views each illustrating a step in the method for manufacturing the semiconductor device 2 according to this embodiment.

Figure 8A:
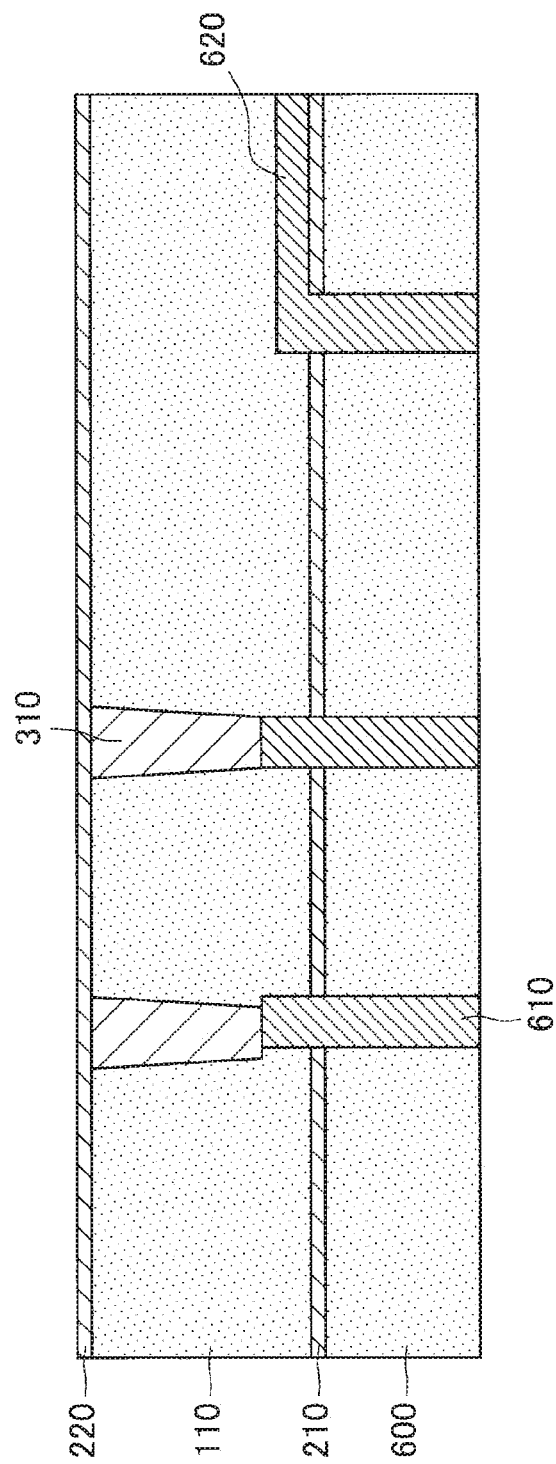
FIG. 8A is a cross-sectional view illustrating a step in a method for manufacturing the semiconductor device according to the embodiment.

First, as shown in FIG. 8A, the via insulating layer 600, the first diffusion preventing film 210, the first interlayer film 110, and the second diffusion preventing film 220 are sequentially stacked by CVD. Further, the contact vias 610 are formed in the via insulating layer 600, and the zeroth wiring line 620 and the first wiring lines 310 are formed in the first interlayer film 110.

Specifically, the via insulating layer 600 is first formed by CVD. Next, after the first diffusion preventing film 210 is formed on the via insulating layer 600 by CVD, the via insulating layer 600 and the first diffusion preventing film 210 in predetermined regions are removed by etching. After that, a barrier metal layer such as a titanium nitride (TiN) layer is formed by a sputtering technique in the openings formed by the etching, and tungsten (W) is then buried in the openings, to form the contact vias 610 and the zeroth wiring line 620.

After the first interlayer film 110 is formed on the first diffusion preventing film 210 by CVD, the first interlayer film 110 in predetermined regions is removed by etching, and the resultant openings are filled with copper (Cu) or the like by a damascene technique, so that the first wiring lines 310 are formed. After that, the second diffusion preventing film 220 is formed on the entire surfaces of the first interlayer film 110 and the first wiring lines 310 by CVD.

Note that the via insulating layer 600 and the first interlayer film 110 may be formed with $SiO_x$ or the like, on which etching with hydrofluoric acid is easily performed, and the first diffusion preventing film 210 and the second diffusion preventing film 220 may be formed with SiC or the like having a high etching resistance to hydrofluoric acid.

Next, as shown in FIG. 8B, part of the second diffusion preventing film 220 is removed by a photolithography technique or the like, so that an opening 530A is formed. The opening 530A functions as the opening for introducing an etching solution from the second interlayer film 120 to the first interlayer film 110 in the process of forming the air gap 530 at a later stage.

As shown in FIG. 8C, the second interlayer film 120, the third diffusion preventing film 230, the third interlayer film 130, and the fourth diffusion preventing film 240 are sequentially stacked on the second diffusion preventing film 220 by CVD. Further, the second wiring lines 320 and the second through via 420 are formed in the second interlayer film 120, and the third wiring lines 330 and the third through via 430 are formed in the third interlayer film 130.

Specifically, after the second interlayer film 120 is formed on the second diffusion preventing film 220 by CVD, the second interlayer film 120 in predetermined regions is removed by etching, and the resultant openings are filled with copper (Cu) or the like by a damascene technique, so that the second wiring lines 320 and the second through via 420 are formed. Likewise, the third diffusion preventing film 230 and the third interlayer film 130 are then formed on the second wiring lines 320 and the second interlayer film 120 by CVD. The third interlayer film 130 in predetermined regions is then removed by etching, and the resultant openings are filled with copper (Cu) or the like by a damascene technique, so that the third wiring lines 330 and the third through via 430 are formed. After that, the fourth diffusion preventing film 240 is formed on the third wiring lines 330 and the third interlayer film 130 by CVD.

Note that the second interlayer film 120 and the third interlayer film 130 may be formed with SiC or the like, on which etching with hydrofluoric acid is easily performed, and the third diffusion preventing film 230 and the fourth diffusion preventing film 240 may be formed with SiC or the like having a high etching resistance to hydrofluoric acid.

Figure 8D:
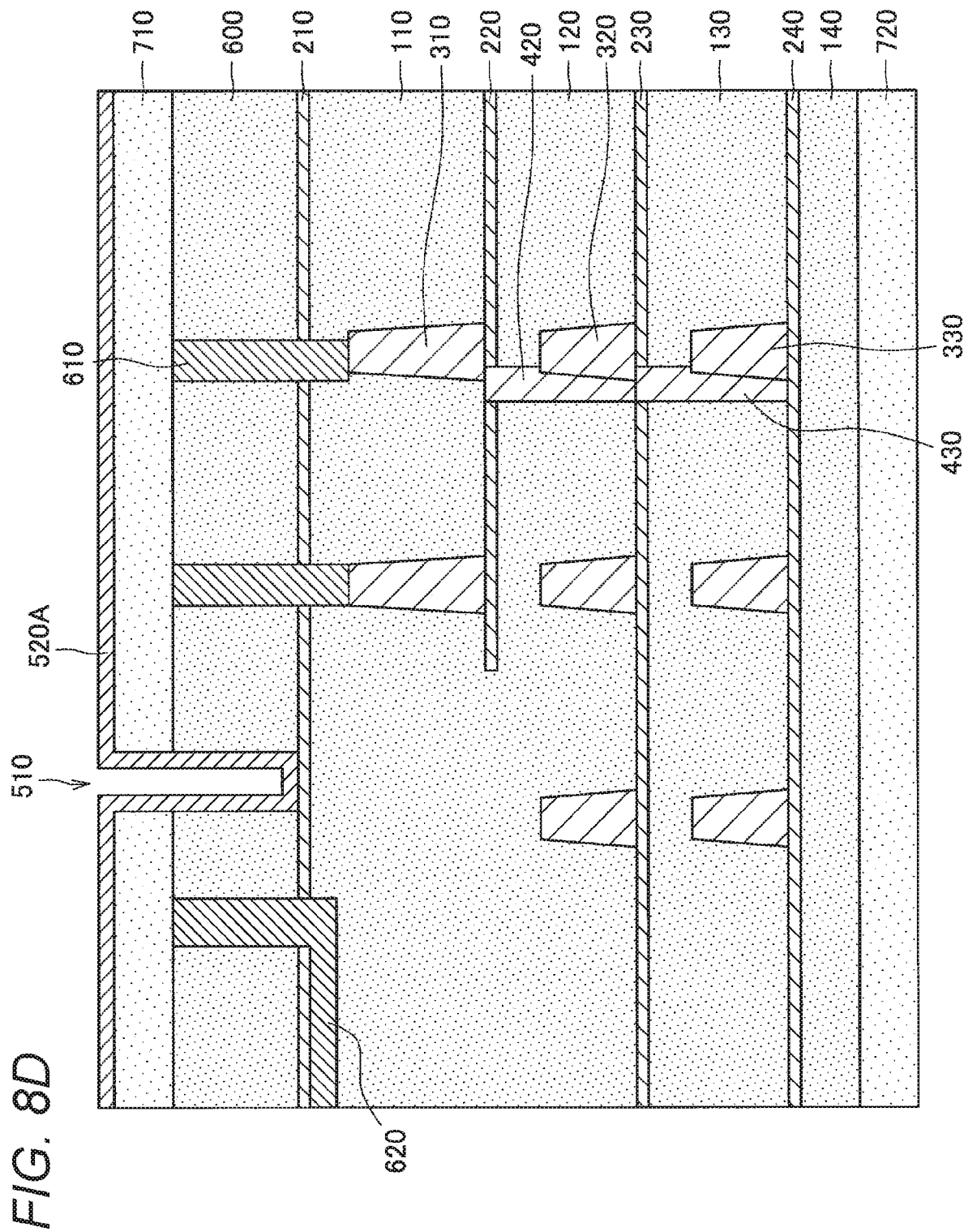
FIG. 8D is a cross-sectional view illustrating a step in the method for manufacturing the semiconductor device according to the embodiment.

Next, as shown in FIG. 8D, after the fourth interlayer film 140 is stacked on the fourth diffusion preventing film 240 by CVD, the substrate 720 is joined to the surface of the fourth interlayer film 140, and the substrate 710 is also joined to the side of the via insulating layer 600. As a result, the multilayer wiring layer 101 is interposed between the substrates 710 and 720. After that, the through hole 510 and the protective film 521 are formed on the side of the substrate 710.

The fourth interlayer film 140 may be formed with $SiO_x$ or the like, on which etching with hydrofluoric acid is easily performed. The fifth diffusion preventing film 250 may be formed with SiC or the like having a high etching resistance to hydrofluoric acid. Further, the substrates 710 and 720 may be silicon (Si) substrates. The substrates 710 and 720 may be reduced in thickness by CMP or the like, after the multilayer wiring layer 101 is joined thereto.

The through hole 510 is formed by removing some of the regions of the substrate 710 and the via insulating layer 600 by etching. Further, the protective film 520A is uniformly (conformally) formed on the substrate 710 and inside the through hole 510 by ALD. Note that the planar shape of the opening of the through hole 510 may be a square having a side of 50 nm to 300 nm. The protective film 520A may be formed with SiC or the like having a high etching resistance to hydrofluoric acid, and is designed to have a thickness of 5 nm to 30 nm, for example.

Figure 8E:
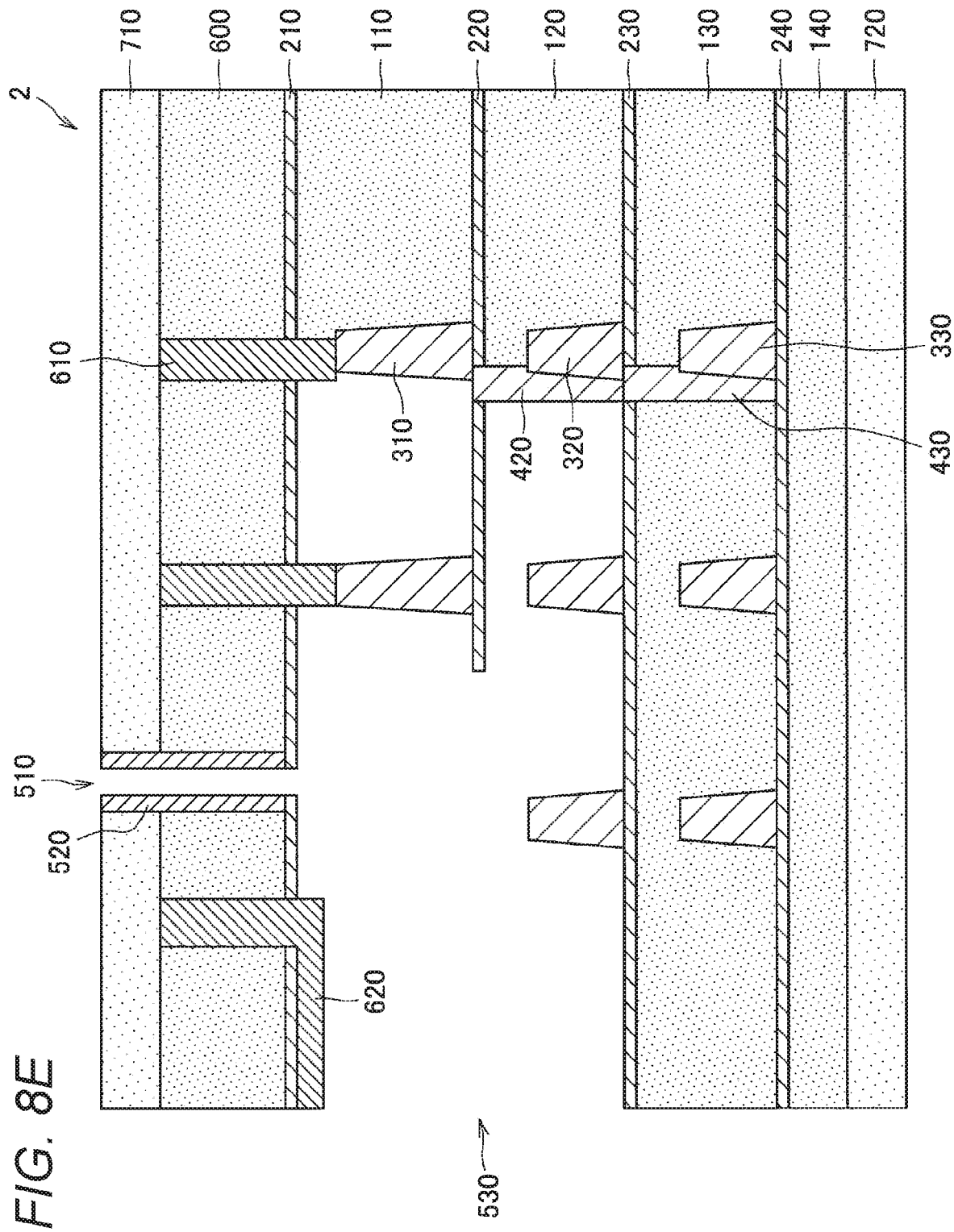
FIG. 8E is a cross-sectional view illustrating a step in the method for manufacturing the semiconductor device according to the embodiment.

Next, as shown in FIG. 8E, etchback on the entire surface is performed, to remove the protective film 520A on the substrate 710, and the protective film 520A and the first diffusion preventing film 210 on the first interlayer film 110. After that, an etching solution or an etching vapor is introduced via the through hole 510, so that etching is performed on the first interlayer film 110 and the second interlayer film 120, to form the air gap 530. Note that the etchback on the entire surface can be performed by performing etching with high perpendicular anisotropy, for example.

Here, the etching on the first interlayer film 110 and the second interlayer film 120 can be performed by wet etching or vapor etching using dilute hydrofluoric acid. Since the protective sidewall 520 and the first through third diffusion preventing films 210, 220, and 230 are formed with SiC or the like having a high etching resistance to hydrofluoric acid, the etching hardly progresses at this stage. Further, the contact vias 610, the zeroth wiring line 620, the first wiring lines 310, the second wiring lines 320, and a first through via 410 are formed with a metallic material such as copper (Cu) or tungsten (W), and have a high etching resistance to hydrofluoric acid. Thus, the etching hardly progresses. With this arrangement in the semiconductor device 2, selective etching can be performed on the first interlayer film 110 and the second interlayer film 120, to form the air gap 530.

Through the above steps, the semiconductor device 2 according to this embodiment can be manufactured. Note that, to prevent entry of moisture and the like into the air gap 530, a sealing layer formed with an insulating material may be formed on the substrate 710 to close the opening of the through hole 510.

By the method for manufacturing the semiconductor device 2 according to this embodiment, the air gap 530 can be formed after the substrates 710 and 720 are reduced in thickness by CMP. Thus, the semiconductor device 2 can reduce formation of cracks and the like due to the air gap 530 in the CMP step in which mechanical stress is applied to the semiconductor device 2.

(2.3. Modification)

Figure 9:
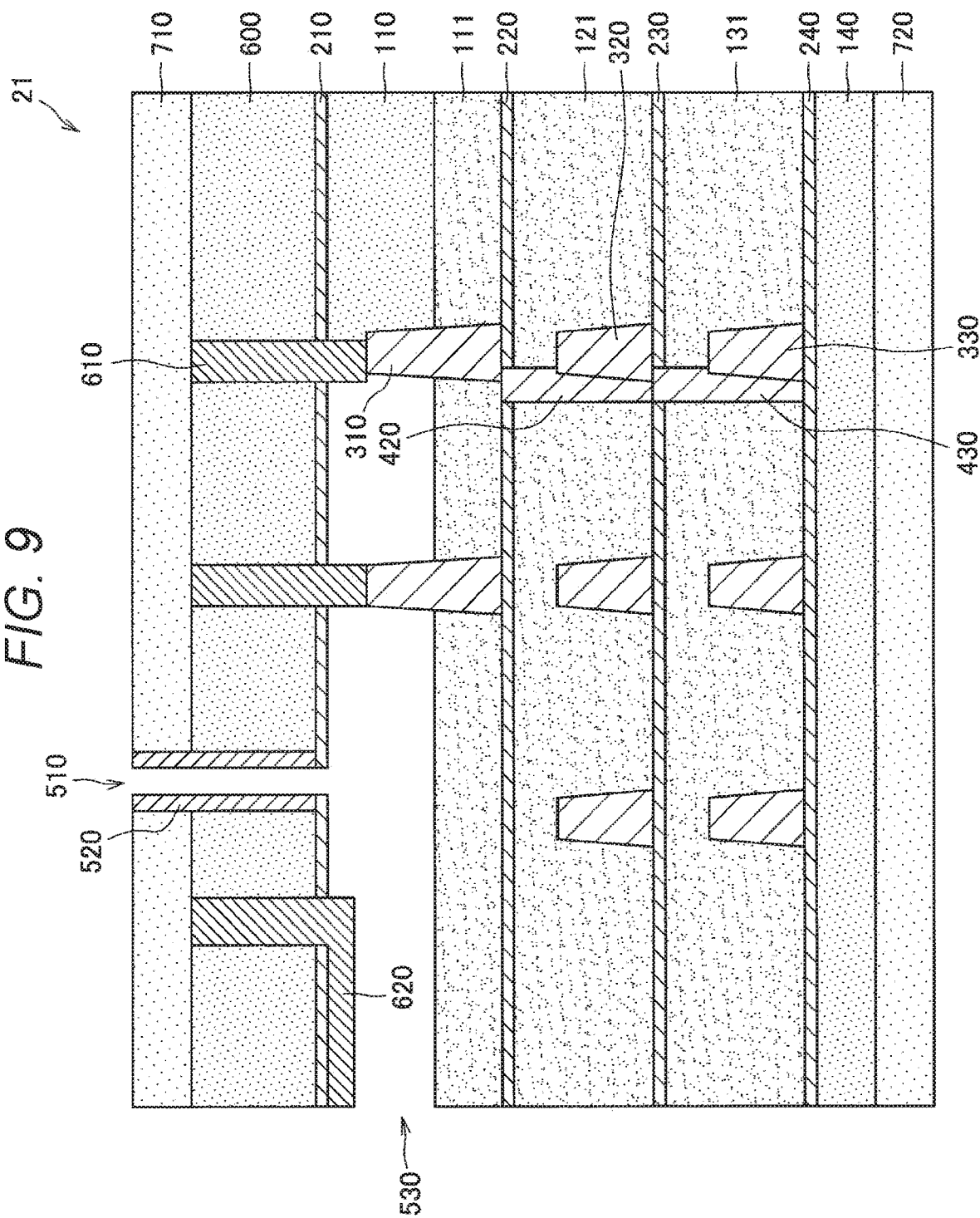
FIG. 9 is a cross-sectional view of a semiconductor device according to a modification of the embodiment, taken in the stacking direction.

Further, a modification of the semiconductor device 2 according to this embodiment is described, with reference to FIG. 9. FIG. 9 is a cross-sectional view of a semiconductor device 21 according to this modification, taken in the stacking direction. Note that FIG. 9 shows part of a cross-section of the semiconductor device, and the semiconductor device of course extends to regions that are not shown in the drawing.

As shown in FIG. 9, in the semiconductor device 21 according to this modification, the interlayer films 100 may be formed with a plurality of different materials. Specifically, the via insulating layer 600 and part of the first interlayer film 110 are formed with a first material, and the remaining portion 111 of the first interlayer film, a second interlayer film 121, and a third interlayer film 131 are formed with a second material different from the first material. For example, the via insulating layer 600 and part of the first interlayer film 110 may be formed with a first material such as $SiO_x$, and the remaining portion 111 of the first interlayer film, the second interlayer film 121, and the third interlayer film 131 may be formed with a second material having a lower relative dielectric constant than $SiO_x$ of the first material (this second material is a so-called low-k material described above). Note that the other components are the same as those described with reference to FIG. 7, and therefore, explanation of them is not made herein.

The air gap 530 is formed in the interlayer films 100 formed with the first material having a higher relative dielectric constant than the second material, so that the capacitance between the wiring lines 300 can be effectively reduced. However, it goes without saying that the air gap 530 may be formed in the interlayer film(s) 100 formed with a second material having a higher relative dielectric constant than the first material.

Further, in a case where a combination of the first material and the second material is selected so that the etching selectivity of the first material with respect to the second material becomes higher, the air gap 530 can be formed only in the interlayer film(s) 100 formed with the first material. Specifically, by the etching for forming the air gap 530, the air gap 530 can be formed only in part of the first interlayer film 110 formed with the first material. In such a case, the region in which the air gap 530 is to be formed can be controlled more easily in the semiconductor device 21.

3. THIRD EMBODIMENT

Referring now to FIGS. 10, 11, 12, 13A, 13B, and 13C, the configuration of a semiconductor device 3 according to a third embodiment of the present disclosure is described.

Figure 10:
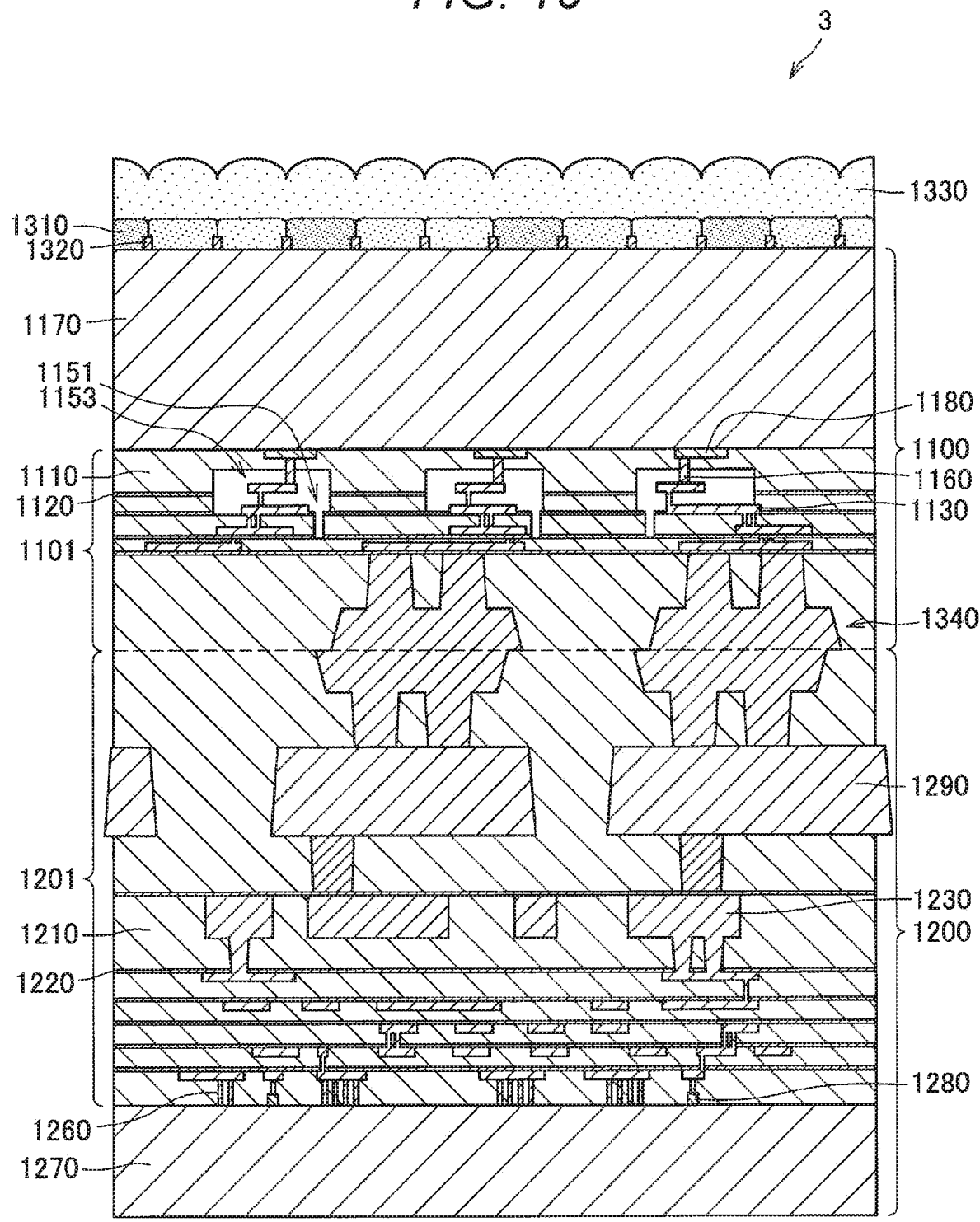
FIG. 10 is a cross-sectional view of a semiconductor device according to a third embodiment of the present disclosure, taken in the stacking direction.

FIG. 10 is a cross-sectional view of a semiconductor device according to this embodiment, taken in the stacking direction.

As shown in FIG. 10, the semiconductor device 3 is a stacked solid-state imaging device formed by stacking a first substrate 1100 and a second substrate 1200. The dashed line in FIG. 10 indicates the bonding plane between the first substrate 1100 and the second substrate 1200.

The first substrate 1100 is a pixel substrate in which a pixel unit is disposed, and the second substrate 1200 is a logic substrate in which circuits for performing various kinds of signal processing related to operation of the semiconductor device 3 are disposed, for example. The semiconductor device 3 photoelectrically converts light entering from one surface of the first substrate 1100 at the pixel unit, and converts the photoelectrically converted signal charges into pixel signals in the second substrate 1200. The semiconductor device 3 may be a so-called back-illuminated complementary metal-oxide-semiconductor (CMOS) image sensor.

The first substrate 1100 is formed primarily with a semiconductor substrate 1170 including silicon (Si), for example, and a multilayer wiring layer 1101 formed on the semiconductor substrate 1170. A pixel unit in which pixels are arranged in a predetermined array, and a pixel signal processing circuit for processing pixel signals are disposed in the semiconductor substrate 1170. A pixel is formed primarily with a photodiode (PD) that receives light (observation light) from an observation target and performs photoelectric conversion, and a drive circuit including a transistor and the like for reading a pixel signal corresponding to the observation light acquired by the PD. In the pixel signal processing circuit, various kinds of signal processing, such as analog-digital conversion (AD conversion), for example, is performed on the read pixel signal.

Interlayer films 1110 and diffusion preventing films 1120 are alternately stacked on one surface of the semiconductor substrate 1170 in which the pixel unit and the pixel signal processing circuit are formed. Wiring lines 1130 for transmitting various kinds of signals such as a drive signal for driving the transistor of a drive circuit and a pixel signal are formed in the interlayer films 1110. In this manner, the multilayer wiring layer 1101 is formed. The wiring lines in the lowermost layer (the layer closest to the side of the semiconductor substrate 1170) of the multilayer wiring layer 1101 are electrically connected, by contact vias 1160 formed with tungsten (W) or the like, for example, to electrodes 1180 or the like that extract signals from the pixel unit or the pixel signal processing circuit. In the semiconductor device 3 according to this embodiment, air gaps 1153 and through holes 1151 for forming the air gaps 1153 are formed in the regions to which the contact vias 1160 are exposed.

The second substrate 1200 is formed primarily with a semiconductor substrate 1270 including silicon, for example, and a multilayer wiring layer 1201 formed on the semiconductor substrate 1270. A logic circuit that performs various kinds of signal processing related to operation of the semiconductor device 3 is formed in the semiconductor substrate 1270. For example, in the logic circuit, control on a drive signal for driving the pixel unit of the first substrate 1100 (which is control on driving of the pixel unit), and control on signal exchange with the outside can be performed.

Interlayer films 1210 and diffusion preventing films 1220 are alternately stacked on one surface of the semiconductor substrate 1270 in which the logic circuit is formed. Wiring layers 1230 for transmitting various kinds of signals related to operation of the logic circuit are formed in the interlayer films 1210. In this manner, the multilayer wiring layer 1201 is formed. The wiring lines in the lowermost layer (the layer closest to the side of the semiconductor substrate 1270) of the multilayer wiring layer 1201 are electrically connected, by contact vias 1260 formed with tungsten (W) or the like, for example, to electrodes 1280 or the like that extract signals from the logic circuit.

Note that pads 1290 that function as an external input/output unit (I/O unit) for exchanging various kinds of signals with the outside may be formed in the multilayer wiring layer 1201. The pads 1290 may be formed with aluminum (Al) or the like, for example.

Here, electrodes are formed in the uppermost layer (the layer farthest from the semiconductor substrate 1170) of the multilayer wiring layer 1101 so that a metal surface is exposed through the interlayer films 1110. Electrodes are also formed in the uppermost layer (the layer farthest from the semiconductor substrate 1270) of the multilayer wiring layer 1201 so that a metal surface is exposed through the interlayer films 1210 in a similar manner. These electrodes constitute an electrode joining structure 1340 for electrically connecting signal lines, ground lines, and power supply lines formed in the respective substrates when the first substrate 1100 and the second substrate 1200 are bonded to each other.

In such a stack structure of the first substrate 1100 and the second substrate 1200, a color filter layer 1310 and a microlens array 1330 are disposed, via an insulating film or the like, on the other surface of the semiconductor substrate 1170 on the opposite side from the surface on which the multilayer wiring layer 1101 is disposed.

The color filter layer 1310 is formed with a plurality of color filters arranged to correspond to pixels. The microlens array 1330 is formed with a plurality of microlenses arranged to correspond to the pixels. The color filter layer 1310 and the microlens array 1330 are formed immediately above the pixel unit, and one color filter and one microlens are provided for the PD of one pixel. Note that the pixels are separated from one another by a light-blocking pixel definition film 1320.

Each color filter of the color filter layer 1310 is of red, green, or blue color, for example. Observation light that has passed through a color filter enters the photodiode of the pixel, and a pixel signal is acquired. Thus, pixel signals of the respective color components of the observation target are acquired. Note that one pixel corresponding to one color filter may function as a subpixel, and one pixel may be formed with a plurality of subpixels. For example, four color subpixels that are a red pixel provided with a red color filter, a green pixel provided with a green color filter, a blue pixel provided with a blue color filter, and a white pixel not provided with any color filter may form one pixel.

The microlens array 1330 is formed so that the respective microlenses are located immediately above the respective color filters. As the microlens array 1330 is provided, the observation light collected by the microlenses enter the photodiodes of the pixels via the color filters. Thus, the microlens array 1330 can improve light collection efficiency for the observation light, and increase the sensitivity of the solid-state imaging device.

Figure 11:
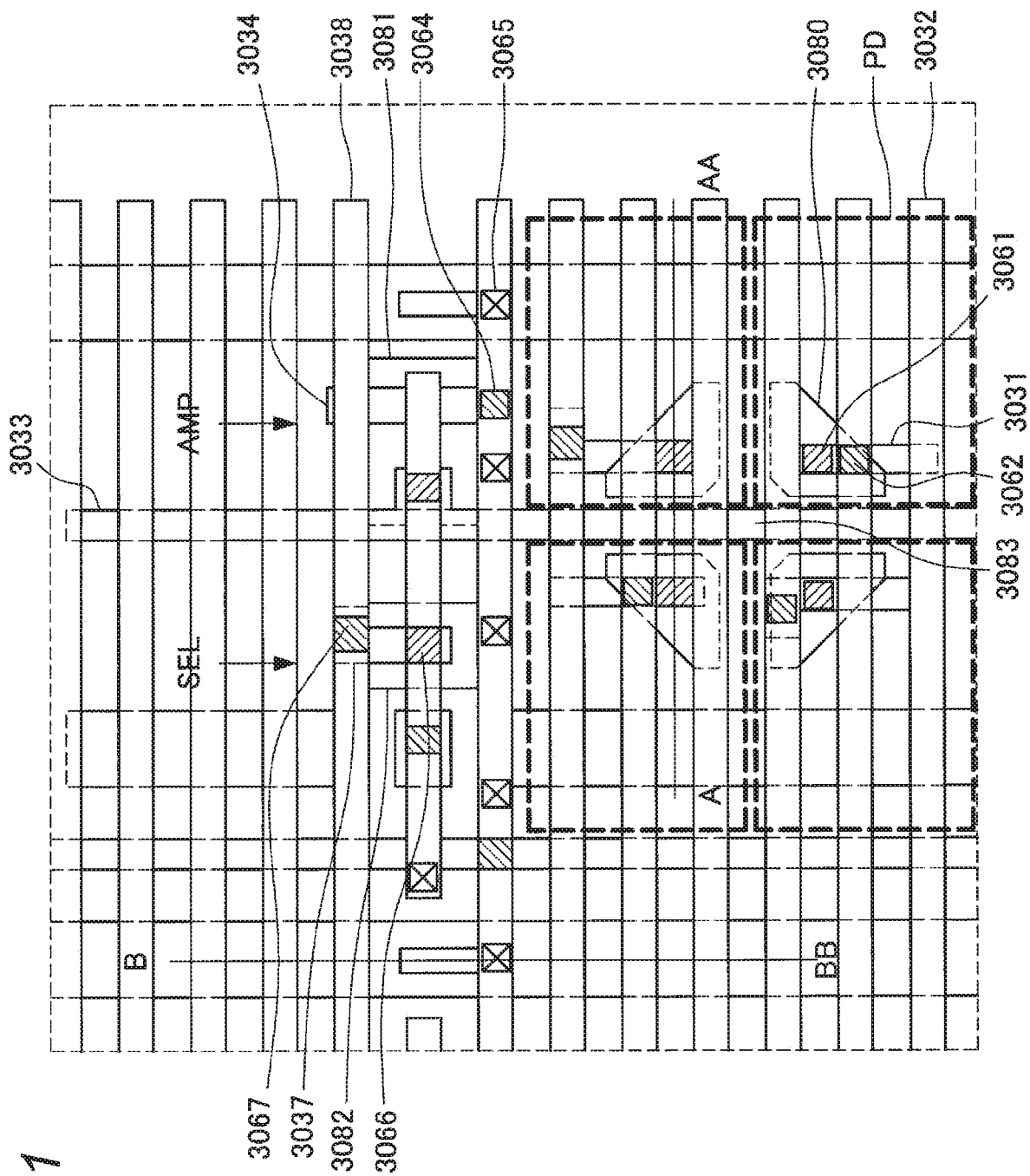
FIG. 11 is a schematic diagram showing the stack structure of each wiring line of the semiconductor device according to the embodiment.
Figure 12:
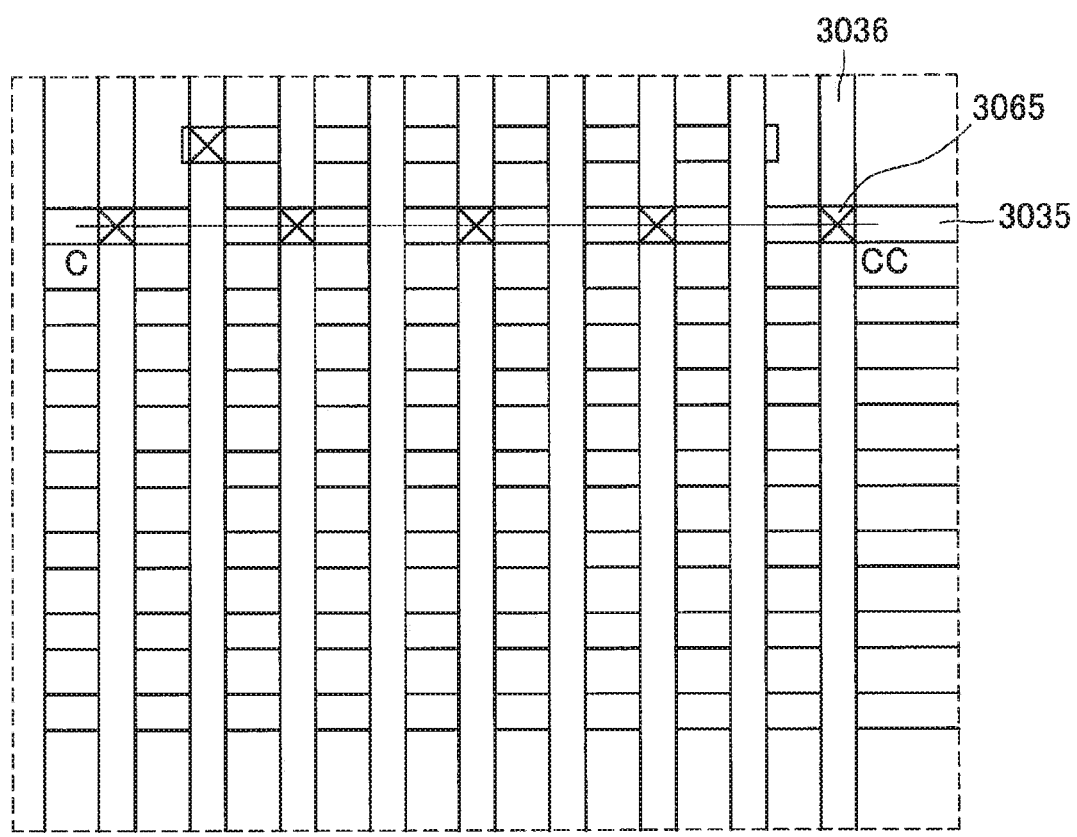
FIG. 12 is a schematic diagram showing the stack structure of each wiring line of the semiconductor device according to the embodiment.

Referring now to FIGS. 11, 12, 13A, 13B, and 13C, specific positions at which the air gaps 1153 are formed in the semiconductor device 3, which is a solid-state imaging device as described above, are explained. FIG. 11 and FIG. 12 are schematic diagrams showing the stack structure formed with the respective wiring lines of the semiconductor device 3, which is a solid-state imaging device. Note that, in FIGS. 11 and 12, the far side of the drawing is the side of the semiconductor substrate 1170, and the planar configuration shown in FIG. 12 is disposed on the planar configuration shown in FIG. 11.

Figure 13A:
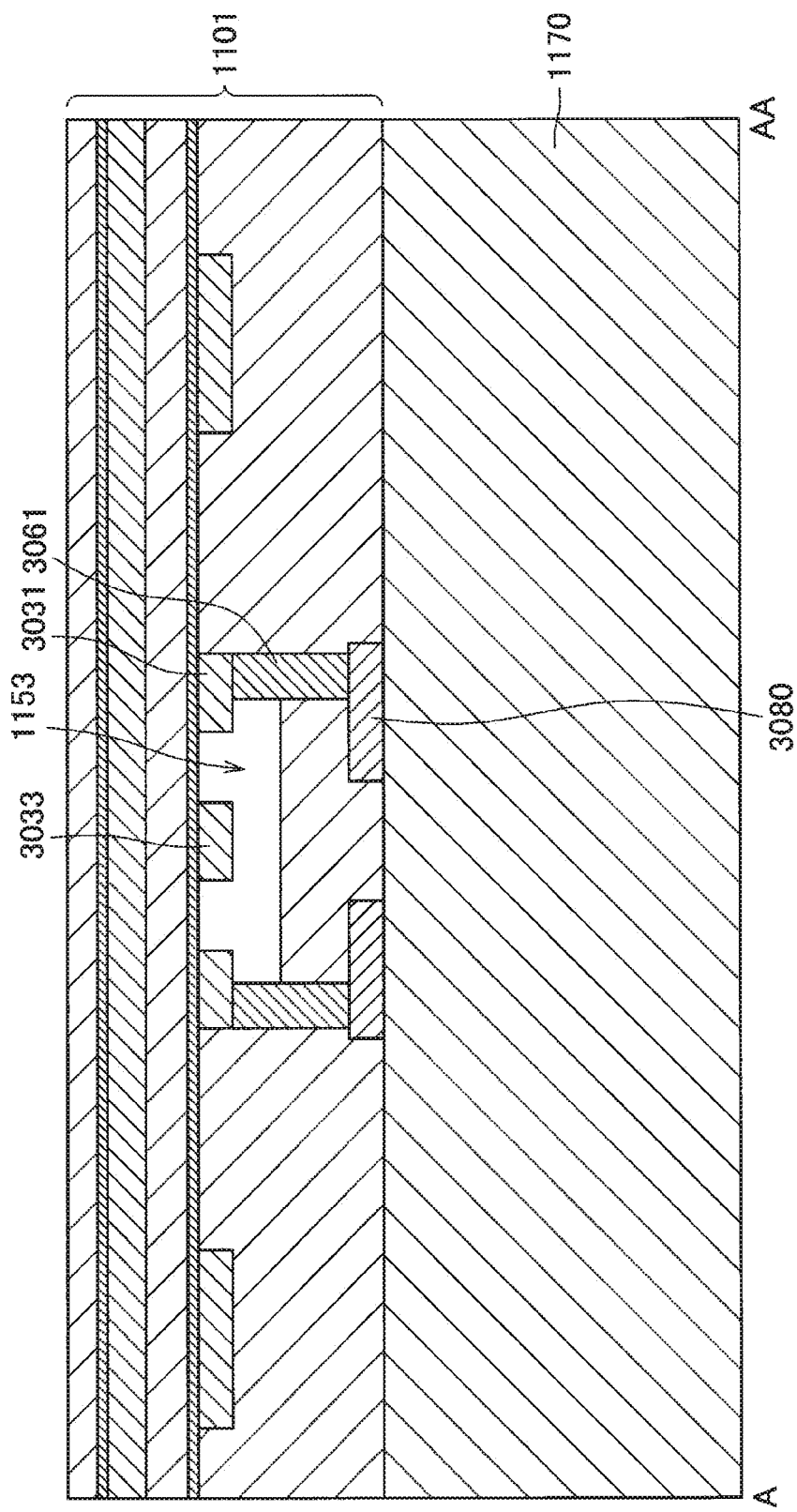
FIG. 13A is a cross-sectional view showing a cross-section taken along the A-AA line shown in FIG. 11.
Figure 13B:
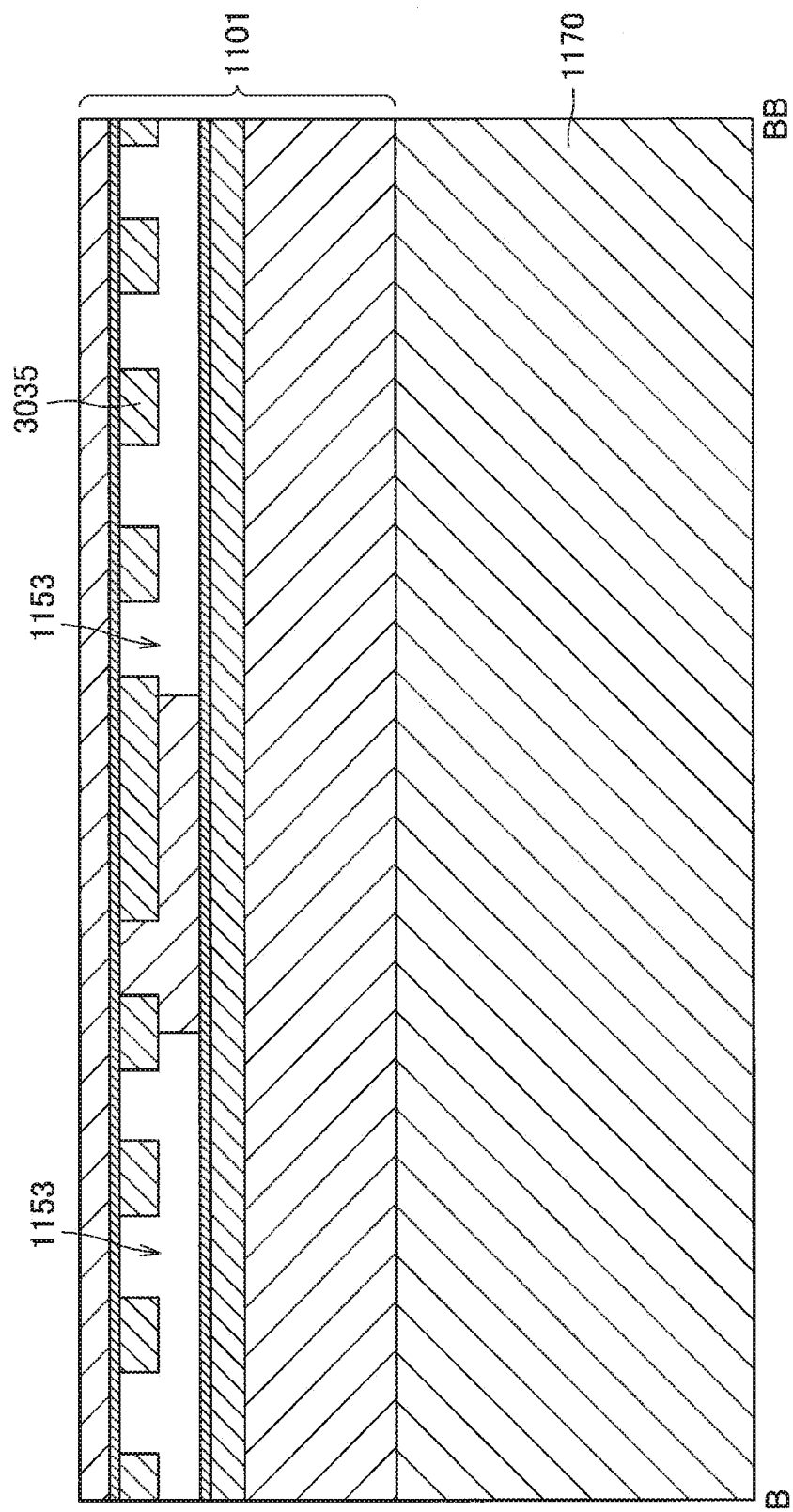
FIG. 13B is a cross-sectional view showing a cross-section taken along the B-BB line shown in FIG. 11.

Further, FIG. 13A is a cross-sectional view showing a cross-section taken along the A-AA line shown in FIG. 11. FIG. 13B is a cross-sectional view showing a cross-section taken along the B-BB line shown in FIG. 11. FIG. 13C is a cross-sectional view showing a cross-section taken along the C-CC line shown in FIG. 12.

As shown in FIG. 11, a photodiode PD is provided for each pixel in the semiconductor substrate 1170. An amplification transistor AMP, a selection transistor SEL, and a reset transistor (not shown) are also provided for each predetermined number of pixels in the semiconductor substrate 1170, and the signal charges photoelectrically converted by the photodiodes PD are converted into pixel signals.

Specifically, a transfer gate 3080 is disposed on each photodiode PD. The transfer gate 3080 transfers the signal charge photoelectrically converted by the photodiode PD to a floating diffusion (FD) region 3083. The signal charge transferred to the floating diffusion (FD) region 3083 is further transmitted to a FD wiring line 3033, and controls the gate voltage of the amplification transistor AMP in a later stage. Note that the transfer gate 3080 functions as the gate electrode of a vertical transistor, and switching on and off of the transfer gate 3080 is controlled by a TG control line 3032 through a via 3061, a wiring line 3031, and a via 3062.

The amplification transistor AMP includes a gate electrode 3081 whose on- and off-states are controlled by the signal charge accumulated in the FD wiring line 3033. The amplification transistor AMP converts the signal charge stored in the FD wiring line 3033 into a current flowing between the source and the drain. The converted current is transmitted to a vertical signal line or a power supply line 3036 shown in FIG. 12, through a wiring line 3034, a via 3064, a wiring line 3035, and a via 3065, for example.

The selection transistor SEL includes a gate electrode 3082 whose on- and off-states are controlled by a signal from a signal line for controlling selection of each pixel. The selection transistor SEL is disposed in series with the amplification transistor AMP, and controls the current flowing between the source and the drain of the amplification transistor AMP. The signal for the gate electrode 3082 of the selection transistor SEL is transmitted through a wiring line 3038, a via 3067, a wiring line 3037, and a via 3066, for example.

Here, as shown in FIG. 13A, the air gap 1153 may be formed around the FD wiring line 3033 to which the signal charge photoelectrically converted by the photodiode PD is transmitted. In such a case, the air gap 1153 may also be formed around the via 3061 that controls on- and off-states of the transfer gate 3080. As the air gap 1153 is formed in such a region, the inter-wire capacitance of the FD wiring line 3033 is reduced, and thus, the semiconductor device 3 can increase the conversion efficiency in converting signal charges into pixel signals.

Further, as shown in FIG. 13B, each air gap 1153 may be formed around the TG control line 3032 that controls on- and off-states of the transfer gate 3080. As each air gap 1153 is formed in such a region, the inter-wire capacitance of the TG control line 3032 is reduced, and thus, the semiconductor device 3 can increase the rate of analog signal transmission.

Further, as shown in FIG. 13C, the air gaps 1153 may be formed around the vertical signal line or the power supply line 3036 connected to the respective pixels. As the air gaps 1153 are formed in such regions, the inter-wire capacitance of the vertical signal line or the power supply line 3036 is reduced, and thus, the semiconductor device 3 can increase the rate of analog signal transmission.

Note that the air gaps 1153 are formed at least in the regions that expose the contact vias electrically connected to the semiconductor substrate 1170 or the electrodes disposed on the semiconductor substrate 1170. At this stage, the contact vias exposed to the air gaps 1153 may be a plurality of contact vias for transmitting the same signal. That is, the contact vias may include dummy contact vias provided for maintaining redundancy. Since the regions in which the air gaps 1153 are formed have a lower mechanical strength than the other regions, a larger number of contact vias may be disposed in such regions than in the other regions so that the contact vias function as support members that support spaces between layers. Examples of such regions include the regions around the FD wiring lines 3033, the regions connected to the transfer gates 3080, and the like, for example.

4. Example Applications (4.1. First Application)

The technology (the present technology) according to the present disclosure can be applied to various products. For example, the technology according to the present disclosure may be applied to an endoscopic surgery system.

Figure 14:
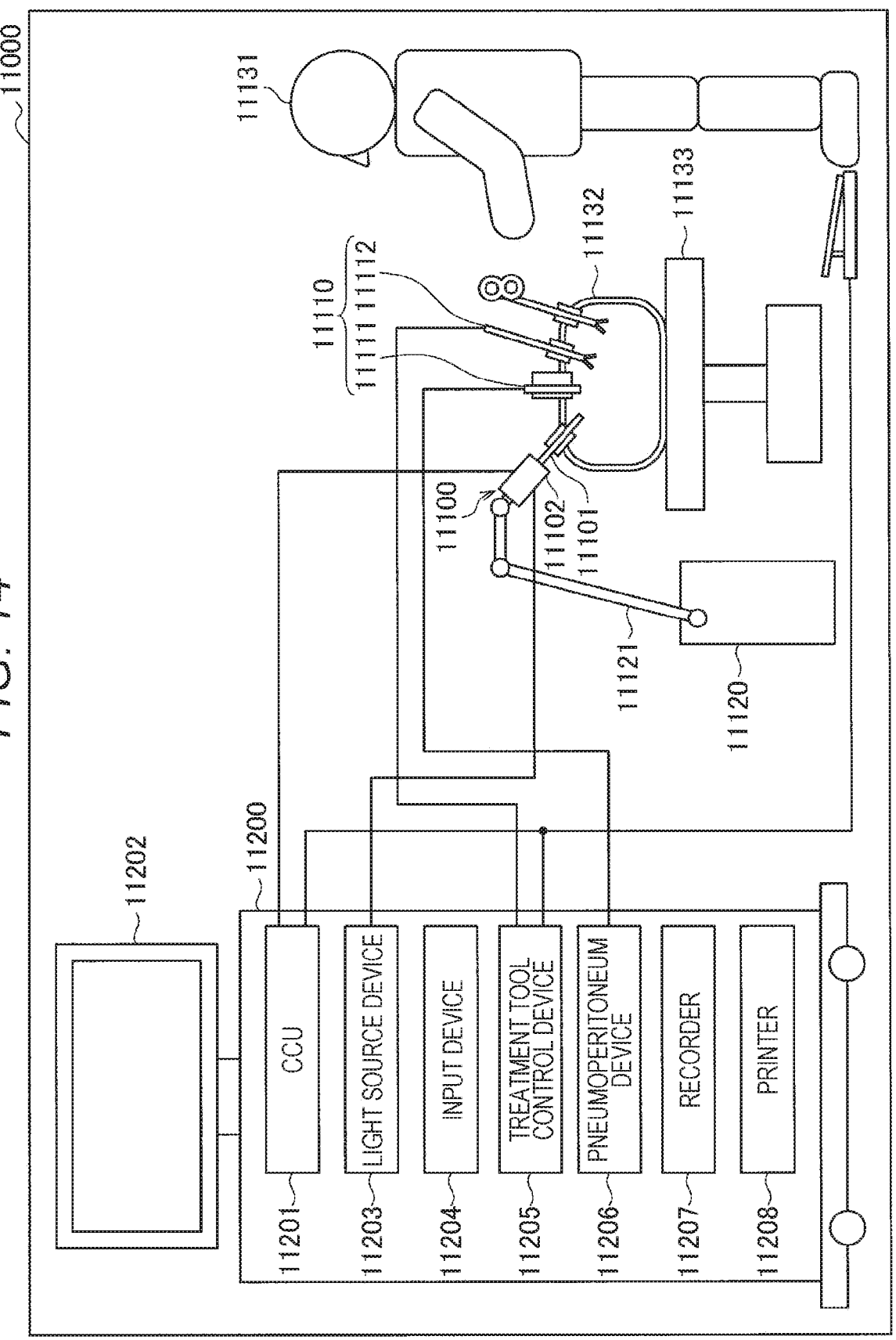
FIG. 14 is a diagram schematically showing an example configuration of an endoscopic surgery system.

FIG. 14 is a diagram schematically showing an example configuration of an endoscopic surgery system to which the technology (the present technology) according to the present disclosure may be applied.

Figure 15:
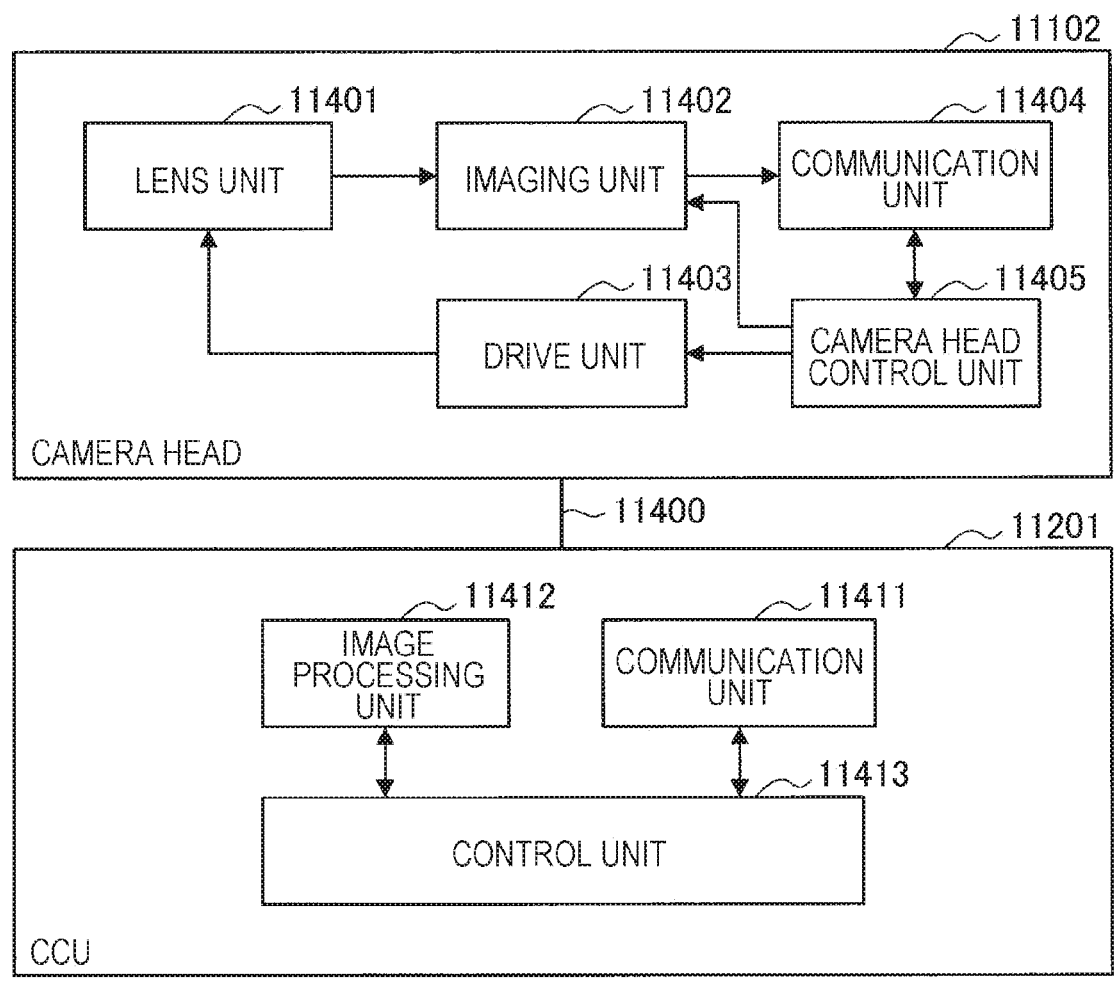
FIG. 15 is a block diagram showing an example of the functional configurations of a camera head and a CCU.

FIG. 15 shows a situation where a surgeon (a physician) 11131 is performing surgery on a patient 11132 on a patient bed 11133, using an endoscopic surgery system 11000. As shown in the drawing, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various kinds of devices for endoscopic surgery are mounted.

The endoscope 11100 includes a lens barrel 11101 that has a region of a predetermined length from the top end to be inserted into a body cavity of the patient 11132, and a camera head 11102 connected to the base end of the lens barrel 11101. In the example shown in the drawing, the endoscope 11100 is designed as a so-called rigid scope having a rigid lens barrel 11101. However, the endoscope 11100 may be designed as a so-called flexible scope having a flexible lens barrel.

At the top end of the lens barrel 11101, an opening into which an objective lens is inserted is provided. A light source device 11203 is connected to the endoscope 11100, and the light generated by the light source device 11203 is guided to the top end of the lens barrel by a light guide extending inside the lens barrel 11101, and is emitted toward the current observation target in the body cavity of the patient 11132 via the objective lens. Note that the endoscope 11100 may be a forward-viewing endoscope, an oblique-viewing endoscope, or a side-viewing endoscope.

An optical system and an imaging device are provided inside the camera head 11102, and reflected light (observation light) from the current observation target is converged on the imaging device by the optical system. The observation light is photoelectrically converted by the imaging device, and an electrical signal corresponding to the obser-vation light, which is an image signal corresponding to the observation image, is generated. The image signal is transmitted as RAW data to a camera control unit (CCU) 11201.

The CCU 11201 is formed with a central processing unit (CPU), a graphics processing unit (GPU), or the like, and collectively controls operations of the endoscope 11100 and a display device 11202. Further, the CCU 11201 receives an image signal from the camera head 11102, and subjects the image signal to various kinds of image processing, such as a development process (demosaicing process), for example, to display an image based on the image signal.

Under the control of the CCU 11201, the display device 11202 displays an image based on the image signal subjected to the image processing by the CCU 11201.

The light source device 11203 is formed with a light source such as a light emitting diode (LED), for example, and supplies the endoscope 11100 with illuminating light for imaging the surgical site or the like.

An input device 11204 is an input interface to the endoscopic surgery system 11000. The user can input various kinds of information and instructions to the endoscopic surgery system 11000 via the input device 11204. For example, the user inputs an instruction or the like to change imaging conditions (such as the type of illuminating light, the magnification, and the focal length) for the endoscope 11100.

A treatment tool control device 11205 controls driving of the energy treatment tool 11112 for tissue cauterization, incision, blood vessel sealing, or the like. A pneumoperitoneum device 11206 injects a gas into a body cavity of the patient 11132 via the pneumoperitoneum tube 11111 to inflate the body cavity, for the purpose of securing the field of view of the endoscope 11100 and the working space of the surgeon. A recorder 11207 is a device capable of recording various kinds of information about the surgery. A printer 11208 is a device capable of printing various kinds of information relating to the surgery in various formats such as text, images, graphics, and the like.

Note that the light source device 11203 that supplies the endoscope 11100 with the illuminating light for imaging the surgical site can be formed with an LED, a laser light source, or a white light source that is a combination of an LED and a laser light source, for example. In a case where a white light source is formed with a combination of RGB laser light sources, the output intensity and the output timing of each color (each wavelength) can be controlled with high precision. Accordingly, the white balance of an image captured by the light source device 11203 can be adjusted. Alternatively, in this case, laser light from each of the RGB laser light sources may be emitted onto the current observation target in a time-division manner, and driving of the imaging device of the camera head 11102 may be controlled in synchronization with the timing of the light emission. Thus, images corresponding to the respective RGB colors can be captured in a time-division manner. According to the method, a color image can be obtained without any color filter provided in the imaging device.

Further, the driving of the light source device 11203 may also be controlled so that the intensity of light to be output is changed at predetermined time intervals. The driving of the imaging device of the camera head 11102 is controlled in synchronism with the timing of the change in the intensity of the light, and images are acquired in a time-division manner and are then combined. Thus, a high dynamic range image with no black portions and no white spots can be generated.

Further, the light source device 11203 may also be designed to be capable of supplying light of a predetermined wavelength band compatible with special light observation. In special light observation, light of a narrower band than the illuminating light (or white light) at the time of normal observation is emitted, with the wavelength dependence of light absorption in body tissue being taken advantage of, for example. As a result, so-called narrow band imaging is performed to image predetermined tissue such as a blood vessel in a mucosal surface layer or the like with high contrast. Alternatively, in the special light observation, fluorescence observation for obtaining an image with fluorescence generated through emission of excitation light may be performed. In fluorescence observation, excitation light is emitted to body tissue so that the fluorescence from the body tissue can be observed (autofluorescence observation). Alternatively, a reagent such as indocyanine green (ICG) is locally injected into body tissue, and excitation light corresponding to the fluorescence wavelength of the reagent is emitted to the body tissue so that a fluorescent image can be obtained, for example. The light source device 11203 can be designed to be capable of suppling narrowband light and/or excitation light compatible with such special light observation.

FIG. 15 is a block diagram showing an example of the functional configurations of the camera head 11102 and the CCU 11201 shown in FIG. 14.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at the connecting portion with the lens barrel 11101. Observation light captured from the top end of the lens barrel 11101 is guided to the camera head 11102, and enters the lens unit 11401. The lens unit 11401 is formed with a combination of a plurality of lenses including a zoom lens and a focus lens.

The imaging unit 11402 may be formed with one imaging device (a so-called single-plate type), or may be formed with a plurality of imaging devices (a so-called multiple-plate type). In a case where the imaging unit 11402 is of a multiple-plate type, for example, image signals corresponding to the respective RGB colors may be generated by the respective imaging devices, and be then combined to obtain a color image. Alternatively, the imaging unit 11402 may be designed to include a pair of imaging devices for acquiring right-eye and left-eye image signals compatible with three-dimensional (3D) display. As the 3D display is conducted, the surgeon 11131 can grasp more accurately the depth of the body tissue at the surgical site. Note that, in a case where the imaging unit 11402 is of a multiple-plate type, a plurality of lens units 11401 are provided for the respective imaging devices.

Further, the imaging unit 11402 is not necessarily provided in the camera head 11102. For example, the imaging unit 11402 may be provided immediately behind the objective lens in the lens barrel 11101.

The drive unit 11403 is formed with an actuator, and, under the control of the camera head control unit 11405, moves the zoom lens and the focus lens of the lens unit 11401 by a predetermined distance along the optical axis. With this arrangement, the magnification and the focal point of the image captured by the imaging unit 11402 can be appropriately adjusted.

The communication unit 11404 is formed with a communication device for transmitting and receiving various kinds of information to and from the CCU 11201. The communication unit 11404 transmits the image signal obtained as RAW data from the imaging unit 11402 to the CCU 11201 via the transmission cable 11400.

Further, the communication unit 11404 also receives a control signal for controlling the driving of the camera head 11102 from the CCU 11201, and supplies the control signal to the camera head control unit 11405. The control signal includes information about imaging conditions, such as information for specifying the frame rate of captured images, information for specifying the exposure value at the time of imaging, and/or information for specifying the magnification and the focal point of captured images, for example.

Note that the above imaging conditions such as the frame rate, the exposure value, the magnification, and the focal point may be appropriately specified by the user, or may be automatically set by the control unit 11413 of the CCU 11201 on the basis of an acquired image signal. In the latter case, the endoscope 11100 has a so-called auto-exposure (AE) function, an auto-focus (AF) function, and an auto-white-balance (AWB) function.

The camera head control unit 11405 controls the driving of the camera head 11102, on the basis of a control signal received from the CCU 11201 via the communication unit 11404.

The communication unit 11411 is formed with a communication device for transmitting and receiving various kinds of information to and from the camera head 11102. The communication unit 11411 receives an image signal transmitted from the camera head 11102 via the transmission cable 11400.

Further, the communication unit 11411 also transmits a control signal for controlling the driving of the camera head 11102, to the camera head 11102. The image signal and the control signal can be transmitted through electrical communication, optical communication, or the like.

The image processing unit 11412 performs various kinds of image processing on an image signal that is RAW data transmitted from the camera head 11102.

The control unit 11413 performs various kinds of control relating to display of an image of the surgical site or the like captured by the endoscope 11100, and a captured image obtained through imaging of the surgical site or the like. For example, the control unit 11413 generates a control signal for controlling the driving of the camera head 11102.

Further, the control unit 11413 also causes the display device 11202 to display a captured image showing the surgical site or the like, on the basis of the image signal subjected to the image processing by the image processing unit 11412. In doing so, the control unit 11413 may recognize the respective objects shown in the captured image, using various image recognition techniques. For example, the control unit 11413 can detect the shape, the color, and the like of the edges of an object shown in the captured image, to recognize the surgical tool such as forceps, a specific body site, bleeding, the mist at the time of use of the energy treatment tool 11112, and the like. When causing the display device 11202 to display the captured image, the control unit 11413 may cause the display device 11202 to superimpose various kinds of surgery aid information on the image of the surgical site on the display, using the recognition result. As the surgery aid information is superimposed and displayed, and thus, is presented to the surgeon 11131, it becomes possible to reduce the burden on the surgeon 11131, and enable the surgeon 11131 to proceed with the surgery in a reliable manner.

The transmission cable 11400 connecting the camera head 11102 and the CCU 11201 is an electrical signal cable compatible with electric signal communication, an optical fiber compatible with optical communication, or a composite cable thereof.

Here, in the example shown in the drawing, communication is performed in a wired manner using the transmission cable 11400. However, communication between the camera head 11102 and the CCU 11201 may be performed in a wireless manner.

An example of an endoscopic surgery system to which the technique according to the present disclosure can be applied has been described above. The technology according to the present disclosure may be applied to the imaging unit 11402 of the camera head 11102 and the like in the configuration described above, for example. Specifically, the semiconductor device (a solid-state imaging device) according to the third embodiment of the present disclosure can be applied to the imaging unit 11402 of the camera head 11102 and the like. As the technology according to the present disclosure is applied to the imaging unit 11402 of the camera head 11102, it is possible to obtain a clearer surgical site image with less noise. Thus, the surgeon can check the surgical site without fail. Further, as the surgical site image can be obtained with lower latency, it is possible for the surgeon to perform a treatment with a feeling similar to that in a case where the surgeon is touching and observing the surgical site.

Note that the endoscopic surgery system has been described as an example herein, but the technology according to the present disclosure may be applied to a microscopic surgery system or the like, for example.

(4.2. Second Application)

The technology (the present technology) according to the present disclosure can be applied to various products. For example, the technology according to the present disclosure may be applied to an endoscopic surgery system.

Figure 16:
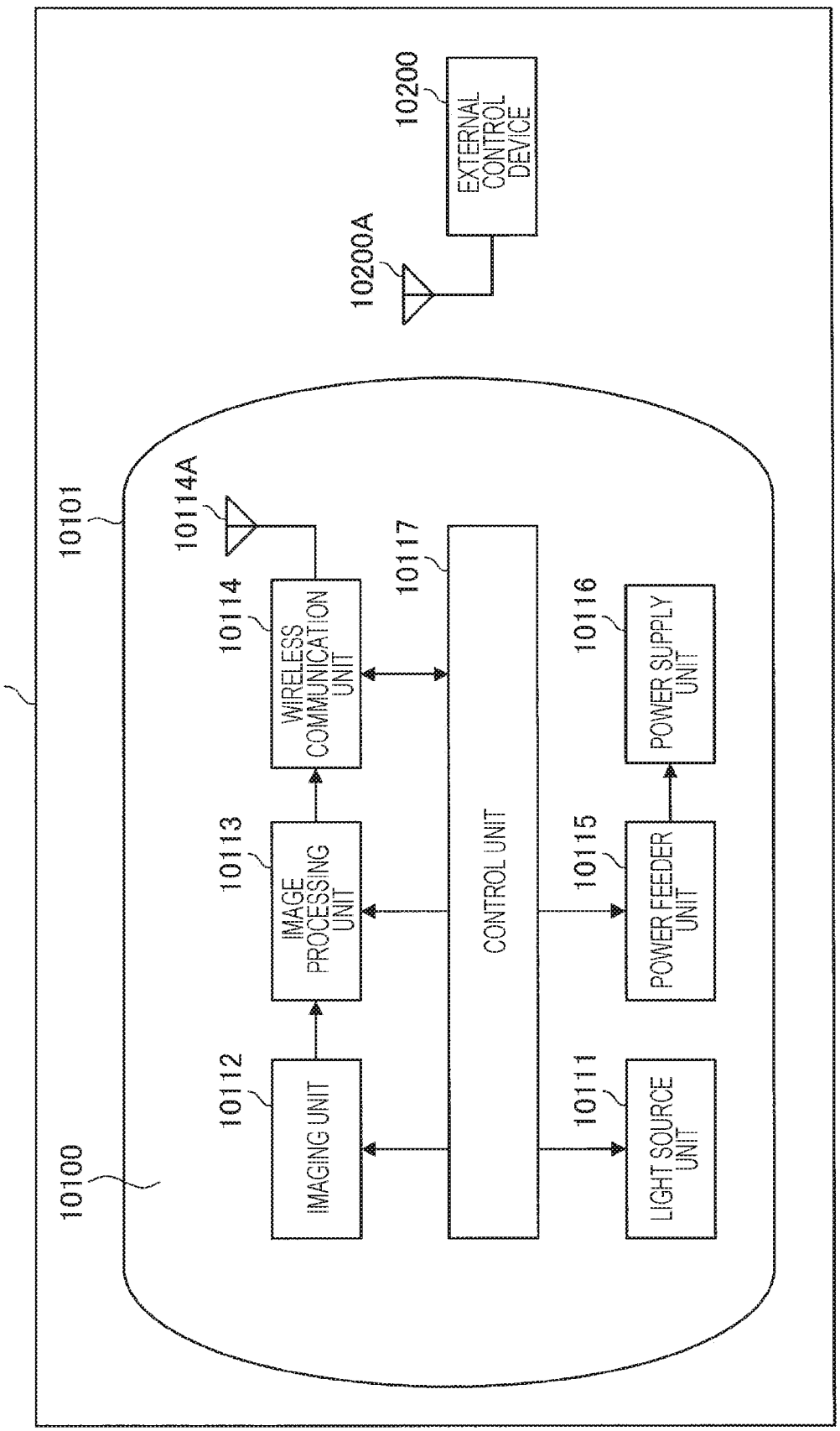
FIG. 16 is a block diagram schematically showing an example configuration of an in-vivo information acquisition system.

FIG. 16 is a block diagram schematically showing an example configuration of a patient's in-vivo information acquisition system using a capsule endoscope to which the technology (the present technology) according to the present disclosure may be applied.

An in-vivo information acquisition system 10001 includes a capsule endoscope 10100 and an external control device 10200.

The capsule endoscope 10100 is swallowed by the patient at the time of examination. The capsule endoscope 10100 has an imaging function and a wireless communication function. Before naturally discharged from the patient, the capsule endoscope 10100 moves inside the internal organs such as the stomach and the intestines by peristaltic motion or the like, sequentially captures images of the inside of the internal organs (these images will be hereinafter also referred to as in-vivo images) at predetermined intervals, and sequentially transmits information about the in-vivo images to the external control device 10200 outside the body in a wireless manner.

The external control device 10200 controls the overall operation of the in-vivo information acquisition system 10001. The external control device 10200 also receives the information about the in-vivo images transmitted from the capsule endoscope 10100, and, on the basis of the received in-vivo image information, generates image data for displaying the in-vivo images on a display device (not shown).

In this manner, the in-vivo information acquisition system 10001 can acquire in-vivo images showing the states of the inside of the body of the patient at any appropriate time until the swallowed capsule endoscope 10100 is discharged.

The configurations and the functions of the capsule endoscope 10100 and the external control device 10200 are now described in greater detail.

The capsule endoscope 10100 has a capsule-like housing 10101, and the housing 10101 houses a light source unit 10111, an imaging unit 10112, an image processing unit 10113, a wireless communication unit 10114, a power feeder unit 10115, a power supply unit 10116, and a control unit 10117.

The light source unit 10111 is formed with a light source such as a light emitting diode (LED), for example, and emits light onto the imaging field of view of the imaging unit 10112.

The imaging unit 10112 is formed with an imaging device and an optical system including a plurality of lenses provided in front of the imaging device. Reflected light of light emitted to body tissue as the current observation target (this reflected light will be hereinafter referred to as the observation light) is collected by the optical system, and enters the imaging device. In the imaging unit 10112, the observation light incident on the imaging device is photoelectrically converted, and an image signal corresponding to the observation light is generated. The image signal generated by the imaging unit 10112 is supplied to the image processing unit 10113.

The image processing unit 10113 is formed with a processor such as a central processing unit (CPU) or a graphics processing unit (GPU), and performs various kinds of signal processing on the image signal generated by the imaging unit 10112. The image processing unit 10113 supplies the image signal subjected to the signal processing as RAW data to the wireless communication unit 10114.

Further, the wireless communication unit 10114 performs predetermined processing such as modulation processing on the image signal subjected to the signal processing by the image processing unit 10113, and transmits the image signal to the external control device 10200 via an antenna 10114A. The wireless communication unit 10114 also receives a control signal related to control of driving of the capsule endoscope 10100 from the external control device 10200 via the antenna 10114A. The wireless communication unit 10114 supplies the control signal received from the external control device 10200 to the control unit 10117.

The power feeder unit 10115 includes an antenna coil for power reception, a power regeneration circuit that regenerates electric power from the current generated in the antenna coil, a booster circuit, and the like. In the power feeder unit 10115, electric power is generated according to a so-called non-contact charging principle.

The power supply unit 10116 is formed with a secondary battery, and stores the electric power generated by the power feeder unit 10115. In FIG. 16, to avoid complication of the drawing, an arrow or the like indicating the destination of power supply from the power supply unit 10116 is not shown. However, the electric power stored in the power supply unit 10116 is supplied to the light source unit 10111, the imaging unit 10112, the image processing unit 10113, the wireless communication unit 10114, and the control unit 10117, and can be used for driving these components.

The control unit 10117 is formed with a processor such as a CPU, and drives the light source unit 10111, the imaging unit 10112, the image processing unit 10113, the wireless communication unit 10114, and the power feeder unit 10115 unit as appropriate in accordance with a control signal transmitted from the external control device 10200.

The external control device 10200 is formed with a processor such as a CPU or a GPU, or a microcomputer, a control board, or the like on which a processor and a storage element such as a memory are mounted together. The external control device 10200 controls operation of the capsule endoscope 10100 by transmitting a control signal to the control unit 10117 of the capsule endoscope 10100 via an antenna 10200A. In the capsule endoscope 10100, the conditions for emitting light to the current observation target in the light source unit 10111 can be changed in accordance with the control signal from the external control device 10200, for example. Further, the imaging conditions (such as the frame rate and the exposure value in the imaging unit 10112, for example) can also be changed in accordance with the control signal from the external control device 10200. Further, the contents of the processing in the image processing unit 10113 and the conditions (such as the transmission intervals and the number of images to be transmitted, for example) for the wireless communication unit 10114 to transmit image signals may be changed in accordance with the control signal from the external control device 10200.

Further, the external control device 10200 also performs various kinds of image processing on the image signal transmitted from the capsule endoscope 10100, and generates image data for displaying a captured in-vivo image on the display device. Examples of the image processing include various kinds of signal processing, such as a development process (a demosaicing process), an image quality enhancement process (a band emphasizing process, a super-resolution process, a noise reduction (NR) process, a camera shake correction process, and/or the like), and/or an enlargement process (an electronic zooming process), for example. The external control device 10200 controls driving of the display device, to cause the display device to display an in-vivo image captured on the basis of the generated image data. Alternatively, the external control device 10200 may cause a recording device (not shown) to record the generated image data, or cause a printing device (not shown) to print out the generated image data.

An example of an in-vivo information acquisition system to which the technology according to the present disclosure can be applied has been described above. The technology according to the present disclosure can be applied to the imaging unit 10112 in the configuration described above. Specifically, the semiconductor device (a solid-state imaging device) according to the third embodiment of the present disclosure can be applied to the imaging unit 10112 and the like. As the technology according to the present disclosure is applied to the imaging unit 10112, a clearer surgical site image can be obtained, and thus, accuracy of examination is increased.

(4.3. Third Application)

The technology (the present technology) according to the present disclosure can be applied to various products. For example, the technology according to the present disclosure may be embodied as a device mounted on any type of moving object, such as an automobile, an electrical vehicle, a hybrid electrical vehicle, a motorcycle, a bicycle, a personal mobility device, an airplane, a drone, a vessel, or a robot.

Figure 17:
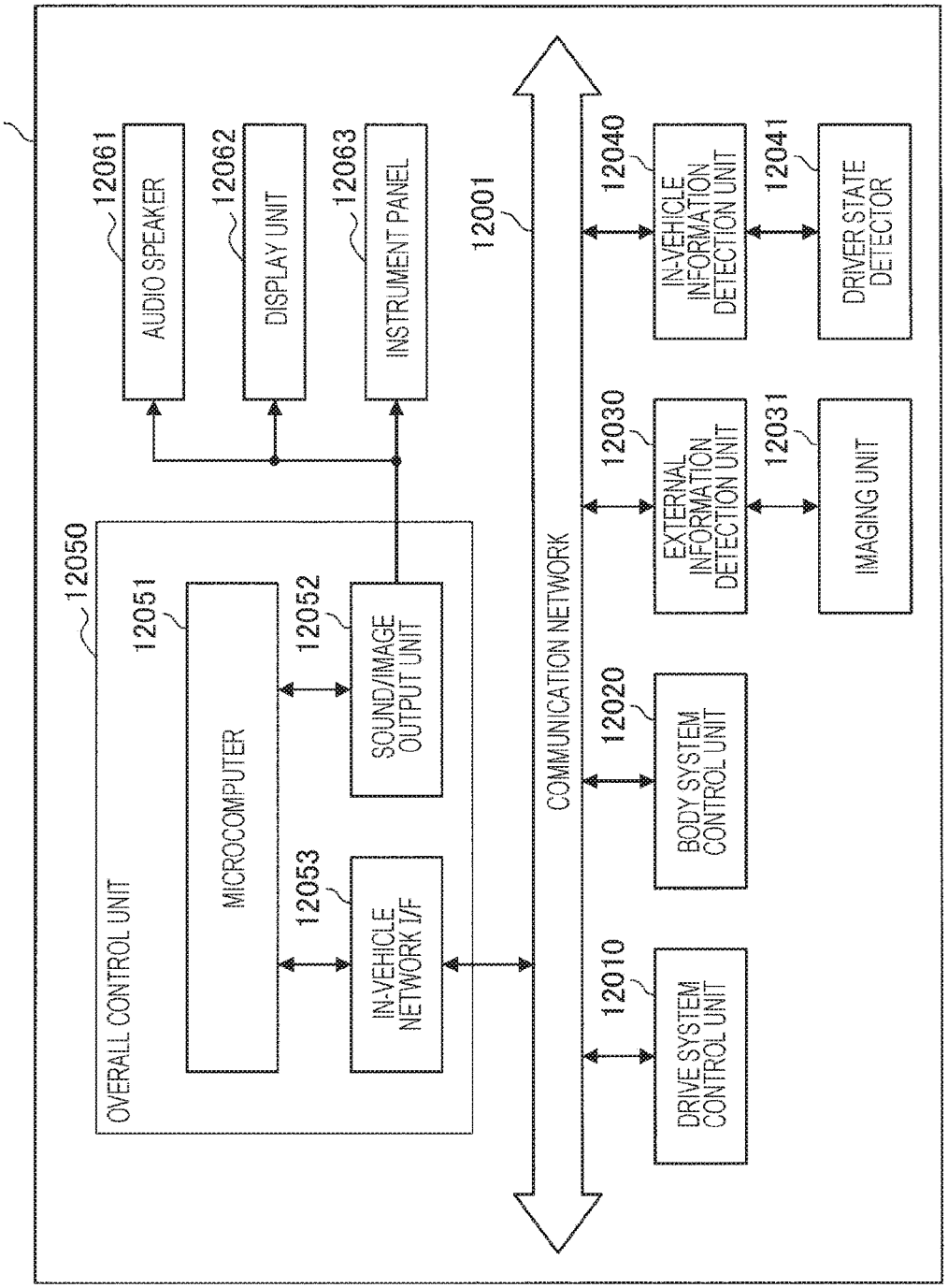
FIG. 17 is a block diagram schematically showing an example configuration of a vehicle control system.

FIG. 17 is a block diagram schematically showing an example configuration of a vehicle control system that is an example of a moving object control system to which the technology according to the present disclosure may be applied.

A vehicle control system 12000 includes a plurality of electronic control units connected via a communication network 12001. In the example shown in FIG. 17, the vehicle control system 12000 includes a drive system control unit 12010, a body system control unit 12020, an external information detection unit 12030, an in-vehicle information detection unit 12040, and an overall control unit 12050. Further, a microcomputer 12051, a sound/image output unit 12052, and an in-vehicle network interface (I/F) 12053 are also shown as the functional components of the overall control unit 12050.

The drive system control unit 12010 controls operations of the devices related to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a headlamp, a backup lamp, a brake lamp, a turn signal lamp, a fog lamp, or the like. In this case, the body system control unit 12020 can receive radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information outside the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image. On the basis of the received image, the external information detection unit 12030 may perform an object detection process for detecting a person, a vehicle, an obstacle, a sign, characters on the road surface, or the like, or perform a distance detection process.

The imaging unit 12031 is an optical sensor that receives light, and outputs an electrical signal corresponding to the amount of received light. The imaging unit 12031 can output an electrical signal as an image, or output an electrical signal as distance measurement information. Further, the light to be received by the imaging unit 12031 may be visible light, or may be invisible light such as infrared rays.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, on the basis of detected information input from the driver state detector 12041, the in-vehicle information detection unit 12040 may calculate the degree of fatigue or the degree of concentration of the driver, or determine whether the driver is dozing off.

On the basis of the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010. For example, the microcomputer 12051 can perform cooperative control to achieve the functions of an advanced driver assistance system (ADAS), including vehicle collision avoidance or impact mitigation, follow-up running based on the distance between vehicles, vehicle velocity maintenance running, vehicle collision warning, vehicle lane deviation warning, or the like.

Further, the microcomputer 12051 can also perform cooperative control to conduct automatic driving or the like for autonomously running not depending on the operation of the driver, by controlling the driving force generation device, the steering mechanism, the braking device, or the like on the basis of information about the surroundings of the vehicle, the information having being acquired by the external information detection unit 12030 or the in-vehicle information detection unit 12040.

Further, the microcomputer 12051 can also output a control command to the body system control unit 12020, on the basis of the external information acquired by the external information detection unit 12030. For example, the microcomputer 12051 controls the headlamp in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIG. 17, an audio speaker 12061, a display unit 12062, and an instrument panel 12063 are shown as output devices. The display unit 12062 may include an on-board display and/or a head-up display, for example.

Figure 18:
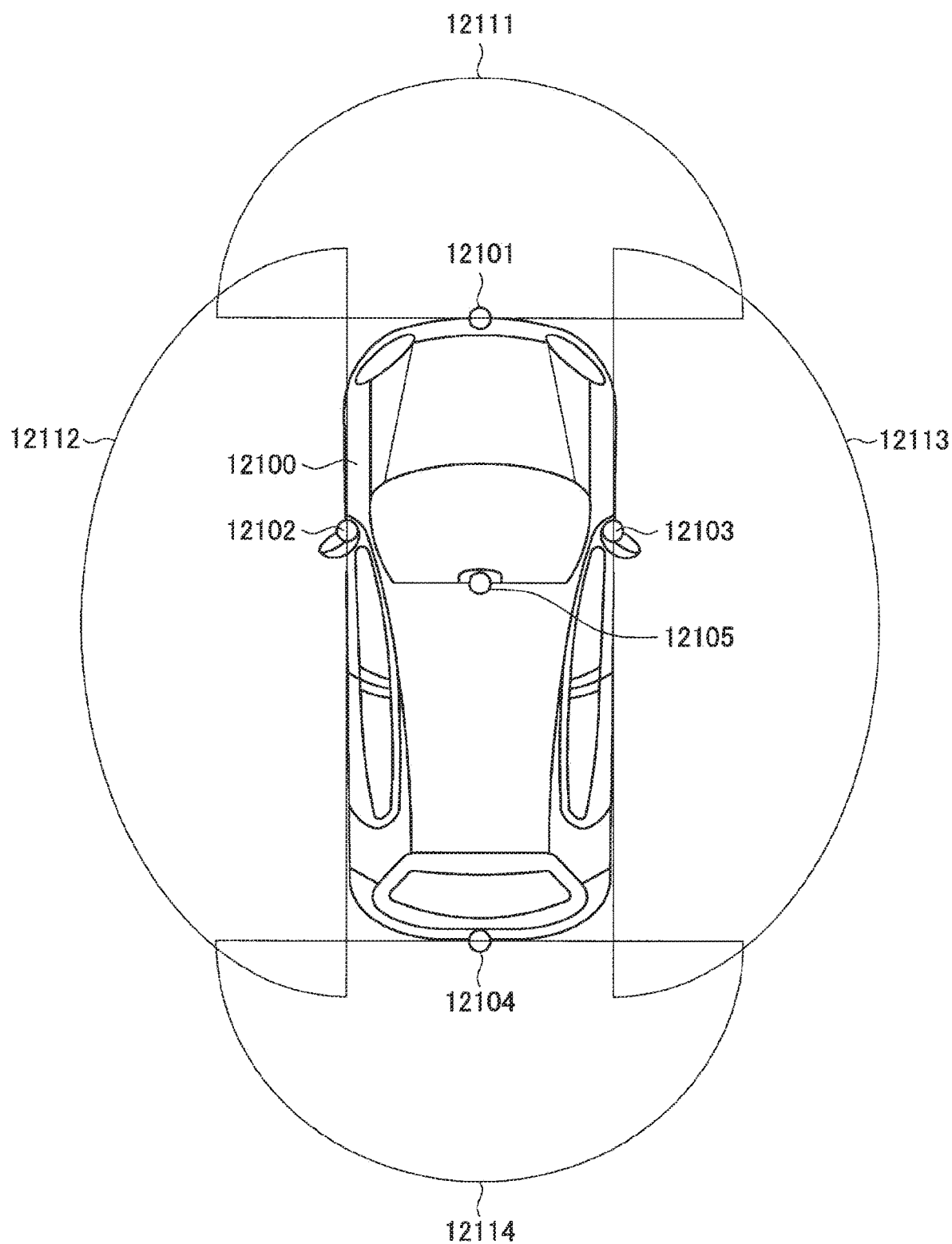
FIG. 18 is an explanatory diagram showing an example of installation positions of external information detectors and imaging units.

FIG. 18 is a diagram showing an example of installation positions of imaging units 12031.

In FIG. 18, imaging units 12101, 12102, 12103, 12104, and 12105 are included as the imaging unit 12031.

Imaging units 12101, 12102, 12103, 12104, and 12105 are provided at the following positions: the front end edge of a vehicle 12100, a side mirror, the rear bumper, a rear door, an upper portion of the front windshield inside the vehicle, and the like, for example. The imaging unit 12101 provided on the front end edge and the imaging unit 12105 provided on the upper portion of the front windshield inside the vehicle mainly capture images ahead of the vehicle 12100. The imaging units 12102 and 12103 provided on the side mirrors mainly capture images on the sides of the vehicle 12100. The imaging unit 12104 provided on the rear bumper or a rear door mainly captures images behind the vehicle 12100. The imaging unit 12105 provided on the upper portion of the front windshield inside the vehicle is mainly used for detection of a vehicle running in front of the vehicle, a pedestrian, an obstacle, a traffic signal, a traffic sign, a lane, or the like.

Note that FIG. 18 shows an example of the imaging ranges of the imaging units 12101 through 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 through 12104 are superimposed on one another, so that an overhead image of the vehicle 12100 viewed from above is obtained.

At least one of the imaging units 12101 through 12104 may have a function of acquiring distance information. For example, at least one of the imaging units 12101 through 12104 may be a stereo camera including a plurality of imaging devices, or may be an imaging device having pixels for phase difference detection.

For example, on the basis of distance information obtained from the imaging units 12101 through 12104, the microcomputer 12051 calculates the distances to the respective three-dimensional objects within the imaging ranges 12111 through 12114, and temporal changes in the distances (the velocities relative to the vehicle 12100). In this manner, the three-dimensional object that is the closest three-dimensional object on the traveling path of the vehicle 12100 and is traveling at a predetermined velocity (0 km/h or higher, for example) in substantially the same direction as the vehicle 12100 can be extracted as the vehicle running in front of the vehicle 12100. Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, on the basis of the distance information obtained from the imaging units 12101 through 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. The microcomputer 12051 then determines collision risks indicating the risks of collision with the respective obstacles. If a collision risk is equal to or higher than a set value, and there is a possibility of collision, the microcomputer 12051 can output a warning to the driver via the audio speaker 12061 and the display unit 12062, or can perform driving support for avoiding collision by performing forced deceleration or avoiding steering via the drive system control unit 12010.

At least one of the imaging units 12101 through 12104 may be an infrared camera that detects infrared rays. For example, the microcomputer 12051 can recognize a pedestrian by determining whether or not a pedestrian exists in images captured by the imaging units 12101 through 12104. Such pedestrian recognition is carried out through a process of extracting feature points from the images captured by the imaging units 12101 through 12104 serving as infrared cameras, and a process of performing a pattern matching on the series of feature points indicating the outlines of objects and determining whether or not there is a pedestrian, for example. If the microcomputer 12051 determines that a pedestrian exists in the images captured by the imaging units 12101 through 12104, and recognizes a pedestrian, the sound/image output unit 12052 controls the display unit 12062 to display a rectangular contour line for emphasizing the recognized pedestrian in a superimposed manner. Further, the sound/image output unit 12052 may also control the display unit 12062 to display an icon or the like indicating the pedestrian at a desired position.

An example of a vehicle control system to which the technology according to the present disclosure may be applied has been described above. The technology according to the present disclosure may be applied to the imaging unit 12031 and the like in the configuration described above. Specifically, the semiconductor device (a solid-state imaging device) according to the third embodiment of the present disclosure can be applied to the imaging unit 12031. As the technology according to the present disclosure is applied to the imaging unit 12031, a captured image that is easier to see can be obtained, and thus, fatigue of the driver can be reduced. Further, as a captured image can be obtained with lower latency, the vehicle can be driven with a feeling similar to that in a case where the driver is directly observing the surroundings.

While preferred embodiments of the present disclosure have been described above with reference to the accompanying drawings, the technical scope of the present disclosure is not limited to those examples. It is apparent that those who have ordinary skills in the technical field of the present disclosure can make various changes or modifications within the scope of the technical spirit claimed herein, and it should be understood that those changes or modifications are within the technical scope of the present disclosure.

Furthermore, the effects disclosed in the present specification are merely illustrative or exemplary, and are not restrictive. That is, the technology according to the present disclosure may exhibit other effects obvious to those skilled in the art from the description in the present specification, in addition to or instead of the effects described above.

Note that the configurations described below are also within the technical scope of the present disclosure.

(1)

A semiconductor device including:

a multilayer wiring layer in which a plurality of interlayer films and a plurality of diffusion preventing films are alternately stacked, and a wiring line is formed in the interlayer films;

a contact via that penetrates a via insulating layer formed on one surface of the multilayer wiring layer, and is electrically connected to the wiring line of the multilayer wiring layer;

a through hole that penetrates at least one of the interlayer films and the diffusion preventing films from the other surface of the multilayer wiring layer on the opposite side from the one surface of the multilayer wiring layer; and an air gap that is connected to the through hole, and is formed in at least one of the interlayer films, to expose the contact via.

(2)

The semiconductor device according to (1), in which a semiconductor substrate is further disposed on the other surface of the via insulating layer on the opposite side from a surface on which the multilayer wiring layer is formed.

(3)

The semiconductor device according to (2), in which a photodiode is disposed in the semiconductor substrate.

(4)

The semiconductor device according to (3), in which the air gap is formed in a region in contact with a FD wiring line that stores a signal charge read from the photodiode.

(5)

The semiconductor device according to (3) or (4), in which the air gap is further formed in a region in contact with a TG control line electrically connected to a gate of a transfer transistor that controls reading of a signal charge from the photodiode.

(6)

The semiconductor device according to (5), in which the contact via is electrically connected to the gate of the transfer transistor.

(7)

The semiconductor device according to any one of (3) to (6), in which the air gap is further formed in a region in contact with a vertical signal line or a power supply line electrically connected to a pixel circuit that converts a signal charge read from the photodiode into a pixel signal.

(8)

The semiconductor device according to any one of (2) to (7), in which a substrate as opposed to the semiconductor substrate is further disposed on a side of the other surface of the multilayer wiring layer.

(9)

The semiconductor device according to any one of (1) to (8), in which the contact via is formed to protrude in the interlayer film disposed on a side of the via insulating layer of the multilayer wiring layer.

(10)

The semiconductor device according to any one of (1) to (9), in which the air gap is further formed in at least one of the interlayer films.

(11)

The semiconductor device according to (10), in which the air gap is further formed in a plurality of the interlayer films, and an opening is formed in part of the diffusion preventing film between the interlayer films in which the air gap is formed.

(12)

The semiconductor device according to (11), in which each of the interlayer films is formed with a first material or a second material having a lower relative dielectric constant than the first material, and the air gap is formed in the interlayer films formed with the first material.

(13)

The semiconductor device according to any one of (1) to (12), in which the wiring line is formed with a first metal, and the contact via is formed with a second metal different from the first metal.

(14)

The semiconductor device according to (13), in which a wiring line that is connected to the contact via and is formed with the second metal is further formed in the interlayer films.

(15)

The semiconductor device according to (13) or (14), in which the first metal is copper, and the second metal is tungsten.

(16)

The semiconductor device according to (14) or (15), in which surfaces of the contact via and the wiring line formed with the second metal are covered with a protective layer.

(17)

The semiconductor device according to any one of (1) to (16), in which a protective sidewall is further formed inside the through hole.

(18)

The semiconductor device according to (17), in which the diffusion preventing films and the protective sidewall are each formed with a material having a higher etching resistance to a fluorine compound than the interlayer films.

REFERENCE SIGNS LIST 1, 2, 3, 11, 12, 13A, 13B, 13C, 14, 21 Semiconductor device
100 Interlayer film
101 Multilayer wiring layer
200 Diffusion preventing film
300 Wiring line
400 Through via
510 Through hole
520 Protective sidewall
530 Air gap
600 Via insulating layer
610 Contact via
620 Zeroth wiring line
710, 720 Substrate

The invention claimed is:

1. A semiconductor device, comprising:
a multilayer wiring layer comprising:
a plurality of interlayer films;
a plurality of diffusion preventing films; and
a plurality of wiring lines in the plurality of interlayer films,
wherein the plurality of interlayer films and the plurality of diffusion preventing films are alternatively stacked;
a contact via configured to penetrate a via insulating layer formed on a first surface of the multilayer wiring layer, wherein the contact via is electrically connected to at least one wiring line of the plurality of wiring lines of the multilayer wiring layer;
a through hole configured to penetrate at least one interlayer film of the plurality of interlayer films and at least one diffusion preventing film of the plurality of diffusion preventing films, wherein
the through hole penetrates the at least one interlayer film and the at least one diffusion preventing film from a second surface of the multilayer wiring layer, and
the second surface of the multilayer wiring layer is on an opposite side from the first surface of the multilayer wiring layer;
an air gap connected to the through hole,
wherein the air gap is in the at least one interlayer film, to expose the contact via; and
a first semiconductor substrate on a first surface of the via insulating layer, wherein
the first surface of the via insulating layer is on an opposite side of a second surface, of the via insulating layer, on which the multilayer wiring layer is formed,
the first semiconductor substrate comprises a photodiode,
the air gap is further formed in a region in contact with a floating diffusion (FD) wiring line, and
the FD wiring line is configured to store a signal charge read from the photodiode.

2. The semiconductor device according to claim 1, wherein
the air gap is further formed in a region which is in contact with a transfer gate EMI control line, and
the TG control line is electrically connected to a gate of a transfer transistor configured to control reading of the signal charge from the photodiode.

3. The semiconductor device according to claim 2, wherein the contact via is electrically connected to the gate of the transfer transistor.

4. The semiconductor device according to claim 1, wherein
the air gap is further formed in a region in contact with one of a vertical signal line or a power supply line, and
the vertical signal line and the power supply line are electrically connected to a pixel circuit that converts a signal charge read from the photodiode into a pixel signal.

5. The semiconductor device according to claim 1, further comprising a second semiconductor substrate, different from the first semiconductor substrate, on a side of the second surface of the multilayer wiring layer.

6. The semiconductor device according to claim 1, wherein the contact via is configured to protrude in the at least one interlayer film on a side of the second surface of the via insulating layer on which the multilayer wiring layer is formed.

7. The semiconductor device according to claim 1, wherein
the air gap is in the plurality of the interlayer films, and
an opening is in a part of the at least one diffusion preventing film between the plurality of interlayer films in which the air gap is formed.

8. The semiconductor device according to claim 7, wherein
a first interlayer film of the plurality of interlayer films comprises a first material,
a second interlayer film of the plurality of interlayer films comprises a second material,
wherein a dielectric constant of the second material is lower than a dielectric constant of the first material, and
the air gap is in the first interlayer film.

9. The semiconductor device according to claim 1, wherein
a first wiring line of the plurality of wiring lines comprises first metal, and
the contact via comprises a second metal different from the first metal.

10. The semiconductor device according to claim 9, wherein
a zeroth wiring line of the plurality of wiring lines is connected to the contact via, and
the zeroth wiring line comprises the second metal, and
the zeroth wiring line is in a first interlayer film of the plurality of interlayer films.

11. The semiconductor device according to claim 9, wherein the first metal is copper, and the second metal is tungsten.

12. The semiconductor device according to claim 10, wherein a surface of the contact via and a surface of the zeroth wiring line are covered with a protective layer.

13. The semiconductor device according to claim 1, wherein a protective sidewall is inside the through hole.

14. The semiconductor device according to claim 13, wherein
each diffusion preventing film of the plurality of diffusion preventing films comprises a first material,
the protective sidewall comprises the first material, and
the first material has a higher etching resistance to a fluorine compound than the plurality of interlayer films.

* * * * *